(12) United States Patent
Heinimäki

(10) Patent No.: US 7,812,655 B2
(45) Date of Patent: Oct. 12, 2010

(54) DELAY-LOCKED LOOP CONTROL

(75) Inventor: Harri Tapio Heinimäki, Vantaa (FI)

(73) Assignee: Nokia Corporation, Espoo (FI)

( * ) Notice: Subject to any disclaimer, the term of this patent is extended or adjusted under 35 U.S.C. 154(b) by 247 days.

(21) Appl. No.: 11/973,884

(22) Filed: Oct. 9, 2007

(65) Prior Publication Data

US 2009/0091360 A1 Apr. 9, 2009

(51) Int. Cl.
H03L 7/06 (2006.01)
H03K 7/08 (2006.01)

(52) U.S. Cl. .................. 327/158; 327/161; 375/238

(58) Field of Classification Search .............. 327/149, 327/153, 158, 161; 375/238
See application file for complete search history.

(56) References Cited

U.S. PATENT DOCUMENTS

| | | | |
|---|---|---|---|
| 5,925,133 | A | 7/1999 | Buxton et al. |
| 6,738,675 | B2 | 5/2004 | Dai |
| 6,809,990 | B2 * | 10/2004 | Thomann et al. ......... 365/233.1 |
| 7,439,787 | B2 * | 10/2008 | Hashim et al. .............. 327/172 |
| 7,627,032 | B2 * | 12/2009 | O'Malley et al. ........... 375/238 |
| 7,667,625 | B2 * | 2/2010 | Prodic et al. ................. 341/50 |
| 2006/0214712 | A1 * | 9/2006 | O'Malley et al. ........... 327/175 |

OTHER PUBLICATIONS

Yousefzadeh, V.; Takayama, T.; Maksimovi, D., "Hybrid DPWM with Digital Delay-Locked Loop," Computers in Power Electronics, 2006. COMPEL '06. IEEE Workshops on , vol., No., pp. 142-148, Jul. 16-19, 2006.*

A. Syed, et al; "Digital Pulse Width Modulator Architectures;" IEEE; 2004 359th Annual IEEE Power Electronics Specialists Conference; Germany 2004; pp. 4689-4695.

You-Jen Wang, et al; "All-Digital Delay-Locked Loop/Pulsewidth-Control Loop With Adjustable Duty Cycles;" IEEE Journal of Solid-State Circuits, vol. 41, No. 6, Jun. 2006; pp. 1262-1274.

D. Santos, et al; "A CMOS Delay Locked Loop and Sub-Nanosecond Time-to-Digital Converter Chip;" IEEE Transactions on Nuclear Science, vol. 43, No. 3, Jun. 1996; pp. 1717-1719.

R. Aguiar, et al; "Oscilatorless Clock Multiplication"; IEEE International Symposium on Circuits and System, Sydney, Australia, May 2001; whole document.

S. Huerta, et al; "FPGA based Digital Pulse Width Modulator with Time Resolution under 2ns;" IEEE Twenty Second Annual Applied Power Electronics Conference; Anaheim, CA, Feb. 25, 2007-Mar. 1, 2007; whole document.

* cited by examiner

Primary Examiner—Lincoln Donovan
Assistant Examiner—Patrick O'Neill
(74) Attorney, Agent, or Firm—Alfred A. Fressola; Ware, Fressola, Van Der Sluys & Adolphson LLP

(57) ABSTRACT

This invention relates to devices, a chip, a method and a computer-readable medium for controlling operation of a delay-locked loop. A delay-locked loop unit is adapted to trigger generation of first-type edges of a target signal. A main control unit is adapted to control operation of the delay-locked loop unit in a way that the delay-locked loop unit is turned on before generation of each first-type edge of the target signal and turned off after generation of each first-type edge.

21 Claims, 17 Drawing Sheets

DELAY-LOCKED LOOP CONTROL

FIELD OF THE INVENTION

This invention relates to devices, a chip, a method and a computer-readable medium for controlling a delay-locked loop.

BACKGROUND OF THE INVENTION

Delay-locked loops are for instance used in the context of Digital Pulse-Width Modulation (DPWM). DPWM in turn is for instance deployed in energy management hardware, where a switching regulator (e.g. a Switched-Mode Power Supply, SMPS) generates from the battery voltage the voltage level used by a load (for instance a processor of an electronic device). Therein, DPWM is applied in a digital feedback loop of the switching regulator.

Architectures for DPWM targeting digital control of high-frequency switching DC-DC power converters are presented in document "Digital pulse-width modulator architectures" by Syed, E. Ahmen, E. Alarcon, D. Maksimovic, IEEE Power Electronics Specialists Conference, vol. 6, pp. 4689-4695, June 2004, the contents of which document are incorporated herein by reference.

Digital feedback with DPWM usually consumes a lot of power, when the switching frequency (the frequency at which switches are operated to generate the DPWM) and the high-frequency clock used to generate the DPWM are high. However, if a high Direct Current (DC) output voltage accuracy is desired, generally an even higher high-frequency clock is required in current applications based on the system parameters, thus further increasing power consumption of the DPWM.

SUMMARY

In view of the above-described problems, it is, inter alia, a general object of the present invention to provide an improved control of delay-locked loops.

According to a first aspect of the present invention, a device is disclosed, comprising a delay-locked loop unit adapted to trigger generation of first-type edges of a target signal, and a main control unit adapted to control operation of the delay-locked loop unit in a way that the delay-locked loop unit is turned on before generation of each first-type edge of the target signal and turned off after generation of each first-type edge.

According to a second aspect of the present invention, a device is disclosed, comprising means for triggering generation of first-type edges of a target signal, and means for controlling operation of the means for triggering generation of the first-type edges of the target signal in a way that the means for triggering generation of the first-type edges of the target signal is turned on before generation of each first-type edge of the target signal and turned off after generation of each the first-type edge.

According to a third aspect of the present invention, a chip is disclosed, implementing a delay-locked loop unit adapted to trigger generation of first-type edges of a target signal, and a main control unit adapted to control operation of the delay-locked loop unit in a way that the delay-locked loop unit is turned on before generation of each first-type edge of the target signal and turned off after generation of each the first-type edge.

The chip may for instance be a Digital Signal Processor (DSP), an Application Specific Integrated Circuit (ASIC), a Field Programmable Gate Array (FPGA), or any other type of chip. The chip may provide interfaces for receiving and/or outputting signals to allow interaction with further components of an apparatus.

According to a fourth aspect of the present invention, a method is disclosed, comprising controlling operation of a delay-locked loop unit, wherein the delay-locked loop unit is adapted to trigger generation of first-type edges of a target signal, and wherein operation of the delay-locked loop unit is controlled in a way that the delay-locked loop unit is turned on before generation of each first-type edge of the target signal and turned off after generation of each the first-type edge.

According to a fifth aspect of the present invention, a computer-readable medium having a computer program stored thereon is disclosed, the computer program comprising instructions operable to cause a processor to control operation of a delay-locked loop unit, wherein the delay-locked loop unit is adapted to trigger generation of first-type edges of a target signal, and wherein operation of the delay-locked loop unit is controlled in a way that the delay-locked loop unit is turned on before generation of each first-type edge of the target signal and turned off after generation of each the first-type edge.

The computer-readable medium may be any medium that is capable of storing digital data in electric, magnetic, electromagnetic or optic form. The medium may be fixedly installed in a device or may be a removable medium.

According to a sixth aspect of the present invention, a computer program is disclosed, comprising instructions operable to cause a processor to control operation of a delay-locked loop unit, wherein the delay-locked loop unit is adapted to trigger generation of first-type edges of a target signal, and wherein operation of the delay-locked loop unit is controlled in a way that the delay-locked loop unit is turned on before generation of each first-type edge of the target signal and turned off after generation of each the first-type edge.

According to the present invention, the target signal, which may for instance be a pulse-width modulated signal, comprises at least two different types of edges, i.e. first-type edges and second-type edges. Therein, a first-type edge is understood as an edge of a first type, and a second-type edge is understood as an edge of a second type that is different from the first type. The target signal comprises a plurality of first-type edges and a plurality of second-type edges, wherein the edges may for instance appear alternately. The first-type edge may for instance be a falling edge, whereas the second-type edge may for instance be a rising edge, or vice versa. The target signal may for instance be periodic, wherein in each period, a first-type edge and a second-type edge occur, such as for instance a rising edge and a falling edge. A duty cycle of the target signal may be controlled by controlling the time instances at which first-type and/or second-type edges occur.

The delay-locked loop unit may only trigger generation of the first-type edges. Alternatively, the delay-locked loop unit may trigger generation of both first-type edges and second-type edges of the target signal.

The delay-locked loop unit may trigger generation of the first-type edges for instance via a switching signal that is generated by the delay-locked loop unit. The switching signal may be fed into a switching unit that is adapted to generate the target signal, wherein generation of the first-type edges of the target signal is triggered by the switching signal. The switching unit may for instance be a Flip-Flop such as an RS-Flip-Flop.

The main control unit controls operation of the delay-locked loop unit so that the delay-locked loop unit is turned on before generation of each first-type edge of the target signal and is turned off after generation of each first-type edge. This turning-on before the generation of each first-type edge of the target signal and the turning-off after generation of each first-type edge of the target signal is repeatedly performed during the generation of the target signal. This may for instance be accomplished by generating one or more according control signals that are fed into the delay-locked loop unit. The delay-locked loop unit may for instance be turned on only shortly before generation of each first-type edge of the target signal. For instance, the delay-locked loop unit may be turned on only for periods of time that respectively start before a first-type edge of the target signal occurs and end after the first-type edge has occurred. Turning on the delay-locked loop unit before a first-type edge is generated may cause the delay-locked loop unit to generate a switching signal, which is fed into a switching unit and in this way triggers generation of the first-type edge of the target signal. After the first-type edge has been generated, the delay-locked loop is turned off, and is only turned on for generation of the next first-type edge.

If the delay-locked loop unit is adapted to trigger generation of both first-type edges and second-type edges of the target signal, the delay-locked loop unit may for instance be turned on and off for generation of both each first-type edge and each second-type edge. The main control unit may control operation of the delay-locked loop unit in a way that a sum of time periods during which the delay-locked loop is turned on is significantly smaller than a sum of time periods during which the delay-locked loop unit is turned off. For instance, the main control unit may control operation of the delay-locked loop unit in a way that the delay-locked loop is turned off more than 70, 80, 90 or 95 percent of the time during which the target signal is generated.

The delay-locked loop unit may for instance be considered to be turned off when one or more input signals of the delay-locked loop unit are disconnected from a line of one or more delay elements comprised in the delay-locked loop unit. In addition, the turning off may comprise turning off of a phase detector controlling the delay elements in the delay-locked loop unit. The delay-locked loop unit may for instance be considered to be turned on again if one or more input signals of the delay-locked loop unit are connected to a line of one or more delay elements comprised in the delay-locked loop. In addition, the turning on may comprise turning on a phase detector controlling the delay elements in the delay-locked loop unit. During a time period in which the delay-locked loop unit is turned off, electrical components of the delay-locked loop unit, such as for instance a capacitor (for instance in a phase detector that controls the delay elements in the delay-locked loop), may still store energy.

The main control unit may for instance control the delay-locked loop unit at least partially based on an input signal received by the main control unit. At least partially based on the input signal, the main control unit may also trigger generation of the second-type edges. The main control unit may comprise a compensator. The main control unit may interface with a look-up table and/or calculator to be used in the control of the delay-locked loop.

The device according to the first aspect of the present invention allows turning on the delay-locked loop unit only for generation of the first-type edges (or also second-type edges), i.e. the delay-locked loop unit is not turned on during the entire time in which the target signal is generated (e.g. by a switching unit). In this way, a power consumption of the device can be significantly reduced, in particular in case of high switching frequencies of the target signal.

According to a first embodiment of the present invention, the main control unit is further adapted to trigger generation of second-type edges of the target signal. If the target signal is generated by a switching unit, and if the delay-locked loop unit triggers generation of the first-type edges via a switching signal fed into an input of the switching unit, then the main control unit may trigger generation of the second-type edges of the target signal via a further switching signal that is fed into the switching unit. The switching unit may for instance be an RS-Flip-Flop, which receives the switching signals from the delay-locked loop unit and the main control unit via its R (Reset) and S (Set) inputs, respectively. The first-type edges may then for instance be falling edges, and the second-type edges may then for instance be rising edges.

According to a second embodiment of the present invention, the main control unit controls operation of the delay-locked loop unit at least partially based on an input signal received by the main control unit. The input signal may for instance be a signal that is tapped from a circuit that comprises a switching regulator connected to a load and is subsequently analog-to-digital converted. At least partially based on the input signal, also a switching signal for triggering generation of second-type edges of the pulse-width modulated signal may be generated by the main control unit.

According to a third embodiment of the present invention, the device further comprises a switching unit adapted to generate the target signal, wherein generation of the first-type edges of the target signal is triggered via a switching signal generated by the delay-locked loop unit.

The switching unit may for instance comprise an electronic switch, such as for instance an RS-flip-flop with two inputs, wherein for instance an R (Reset) input of the RS-Flip-Flop is fed with the first switching signal. An S (Set) input of the RS-Flip-Flop may for instance be fed with a second switching signal, which may for instance be generated by the main control unit. Rising edges of the target modulated signal may be triggered by the second switching signal via the S input of the RS-Flip-Flop, and falling edges of the target signal may be triggered by the first switching signal via the R input of the RS-Flip-Flop.

According to a fourth embodiment of the present invention, the delay-locked loop unit is adapted to trigger generation of the first-type edges of the target signal at least partially based on a first clock signal.

The first clock signal may for instance be generated by a clock generator and fed into the delay-locked loop unit. Equally well, the delay-locked loop unit may receive the first clock unit from a clock multiplier unit, which increases or decreases a clock frequency of a second clock signal input into the clock multiplier unit. The delay-locked loop unit may for instance trigger generation of the first-type edges of the target signal via a switching signal, wherein generation of the switching signal may at least partially be based on the first clock signal. The switching signal may for instance be fed into an input of a switching unit (e.g. an RS-Flip-Flop) that generates the target signal. The delay-locked loop unit may generate the switching signal only if the delay-locked loop unit is turned on. The switching signal may for instance be generated by the delay-locked loop unit by generating a plurality of delayed representations of the first clock signal or of a representation thereof and combining the plurality of delayed representations of the first clock signal or of a representation thereof into the switching signal. Therein, the switching signal may for instance have a larger clock frequency than the first clock signal.

According to the fourth embodiment of the present invention, the device may further comprise a clock multiplier adapted to change a frequency of a second clock signal to obtain the first clock signal. The clock multiplier may for instance increase or decrease a clock frequency of the second clock signal, which may for instance be generated by a clock generator. Using the clock multiplier to increase a clock frequency of the second clock signal in addition to the turning on and off of the delay-locked loop unit under the control of the main control unit may contribute to even further reduce a power consumption of the device.

The clock multiplier may comprise a delay-locked loop.

The delay-locked loop of the clock multiplier may comprise a line of delay elements that is fed with the second clock signal, a phase detector adapted to control the delay elements based on a comparison of the second clock signal and a delayed representation of the second clock signal, at least one combination unit adapted to combine delayed representations of the second clock signal to obtain a switching signal, and a switching unit adapted to generate the first clock signal at least partially based on the switching signal of the at least one combination unit.

The switching unit in the delay-locked loop of the clock multiplier may for instance be an RS-Flip-Flop, wherein a switching signal of a first combination unit is fed to the R input of the RS-Flip-Flop and a switching signal of a second combination unit is fed to the S input of the RS-Flip-Flop. The first combination unit may for instance combine the delayed representations of the second clock signal as output by the even-numbered delay elements in the line of delay elements (and possibly further delayed by further time delay units), and the second combination unit may combine the delayed representations of the second clock signal as output by the odd-numbered delay elements in the line of delay elements (and possibly further delayed by further time delay units). The phase detector may for instance control the delay elements based on a comparison of the second clock signal and a delayed representation of the second clock signal as output at the end of the line of delay elements.

According to a fifth embodiment of the present invention, the delay-locked loop unit according to the fourth embodiment of the present invention comprises a delay-locked loop adapted to output a plurality of delayed representations of the first clock signal, and a combination unit adapted to combine the plurality of delayed representations of the first clock signal into a signal via which the delay-locked loop unit triggers generation of the first-type edges of the target signal. The signal via which the delay-locked loop unit triggers generation of the first-type edges may for instance be a switching signal that is fed into an input of a switching unit (e.g. an RS-Flip-Flop) that generates the target signal. The combination unit may for instance be a multiplexer. The delay-locked loop and the combination unit may for instance generate a representation of the first clock signal with a higher clock frequency.

An operation of the combination unit may be controlled by the main control unit.

According to a sixth embodiment of the present invention, the delay-locked loop of the delay-locked loop unit according to the fifth embodiment of the present invention comprises a switch adapted to receive a representation of the first clock signal; a line of delay elements connected to an output of the switch, wherein the delay elements in the line of delay elements generate the plurality of delayed representations of the first clock signal; a phase detector adapted to control the delay elements based on a comparison of two different representations of the first clock signal; and a switch and phase detector control unit adapted to control operation of the switch of the delay-locked loop and to turn on and off the phase detector of the delay-locked loop in response to at least one control signal generated by the main control unit. The delay elements may for instance be differential delay elements, or non-differential elements. The representation of the first clock signal may for instance be a differential representation of the first clock signal, e.g. in terms of a positive and a negative signal. The phase detector may control the delay elements in the line of delay elements based on a comparison of a first representation of the first clock signal (for instance tapped before the first delay element in the line of delay elements), and a second representation of the first clock signal (for instance tapped after the last delay element in the line of delay elements). The delay elements may have two signal inputs and two outputs, respectively, and one input for a control signal.

The switch and phase detector control unit may be adapted to close the switch of the delay-locked loop before the phase detector of the delay-locked loop is turned on, if the at least one control signal indicates that the delay-locked loop unit shall be turned on to generate a first-type edge of the target signal. This may allow the phase detector, when being activated, to be able to properly compare both representations of the first clock signal. The switch and phase detector control unit may for instance distribute the at least one control signal generated by the main control unit to the switch basically unamended, and may distribute a delayed version of the control signal to the phase detector. Alternatively, the switch and phase detector control signal may receive two control signals and may distribute one of these control signals to the switch and the other control signal to the phase detector.

The switch and phase detector control unit may be adapted to open the switch of the delay-locked loop and to turn off the phase detector of the delay-locked loop, if the at least one control signal indicates that the delay-locked loop unit shall be turned off after generation of a first-type edge.

The phase detector may control operation of the delay elements via a control voltage, and the phase detector may comprise a capacitor for storing a specific control voltage during the time period the phase detector is turned off.

According to a seventh embodiment of the present invention, the delay-locked loop of the delay-locked loop unit according to the fifth embodiment of the present invention comprises a line of delay elements, wherein the delay elements in the line of delay elements generate the plurality of delayed representations of the first clock signal; a phase detector adapted to control the delay elements based on a comparison of two different representations of the first clock signal; and a switch adapted to feed a representation of the first clock signal into the delay-locked loop in response to a control signal. The delay elements may for instance be differential delay elements, or non-differential elements. The representation of the first clock signal may for instance be a differential representation of the first clock signal, e.g. in terms of a positive and a negative signal. The phase detector may control the delay elements in the line of delay elements based on a comparison of a first representation of the first clock signal, and a second representation of the first clock signal. The delay elements may have two signal inputs and two outputs, respectively, and one input for a control signal.

The first representation of the first clock signal may for instance be a signal tapped from an output of the switch, and the second representation of the first clock signal may for instance be a signal tapped from an output of the last delay element in the line of delay elements. The output of the switch may for instance be fed into the first delay element in the line of delay elements. The switch may connect and disconnect a representation of the first clock signal to/from an input of the first delay element in the line of delay elements and to/from an input of the phase detector in response to the control signal, for instance the control signal generated by the main control unit. The control signal may ensure that the switch only disconnects the first representation of the first clock signal from an input of the first delay element in the line of delay elements and from an input of the phase detector if the first representation of the first clock signal has a specific state, for instance has the value '0' or the value '1', which may form a basis for correct later turning-on of the delay-locked loop unit.

Equally well, the first representation of the first clock signal used by the phase detector to control the delay elements in the line of delay elements may for instance be a signal tapped from the output of a unit that receives at least a representation of the first clock signal as an input, and the second representation of the first clock signal used by the phase detector to control the delay elements in the line of delay elements may for instance be a signal tapped from an output of the last delay element in the line of delay elements. The unit that receives at least a representation of the first clock signal as an input may for instance further receive the control signal used to control the switch as an input, and the output of this unit may for instance be fed into an input of the first delay element in the line of delay elements (and also into the phase detector as said first representation of said first clock signal). The unit may for instance be a logic gate that receives the control signal and a representation of the first clock signal and only outputs the first representation of the first clock signal if the control signal, which may for instance be the control signal generated by the main control unit, has a specific value (e.g. '1' or '0'). For instance, the logic gate may be an AND gate, and this AND gate then may only output the first clock signal if the control signal generated by the main control unit is '1', but not if the control signal is '0'. In this way, it may be achieved that the first representation of the first clock signal fed into the phase detector is always '0' when the delay-locked loop unit is turned off by the control signal generated by the main control unit, which may form a basis for correct later turning-on of the delay-locked loop unit.

According to an eighth embodiment of the present invention, the target signal is a pulse-width modulated signal. The device may then for instance be a digital pulse-width modulator or a part thereof. The pulse-width modulated signal may for instance be used to control a switching unit of a switching regulator, such as a switched-mode power supply. A duty cycle of the pulse-width modulated signal may be constant over time or be time-variant.

According to a ninth embodiment of the present invention, the device further comprises a switching unit adapted to apply a supply voltage to a load via an inductive element in response to the target signal; and an analog-to-digital converter adapted to convert an analog voltage signal tapped between the inductive element and the load into a digital signal, wherein the main control unit controls operation of the delay-locked loop unit at least partially based on the digital signal. The device may further comprise a capacitor arranged in parallel to the load.

According to a tenth embodiment of the present invention, the device is comprised in a portable electronic device. The portable electronic device may for instance be a laptop computer, a personal digital assistant, a mobile phone, a multimedia player or any other type of electronic device.

These and other aspects of the invention will be apparent from and elucidated with reference to the detailed description presented hereinafter. The features of the present invention and of its exemplary embodiments as presented above and in the following detailed description are understood to be disclosed also in all possible combinations with each other.

DETAILED DESCRIPTION OF THE INVENTION

Figure 1:
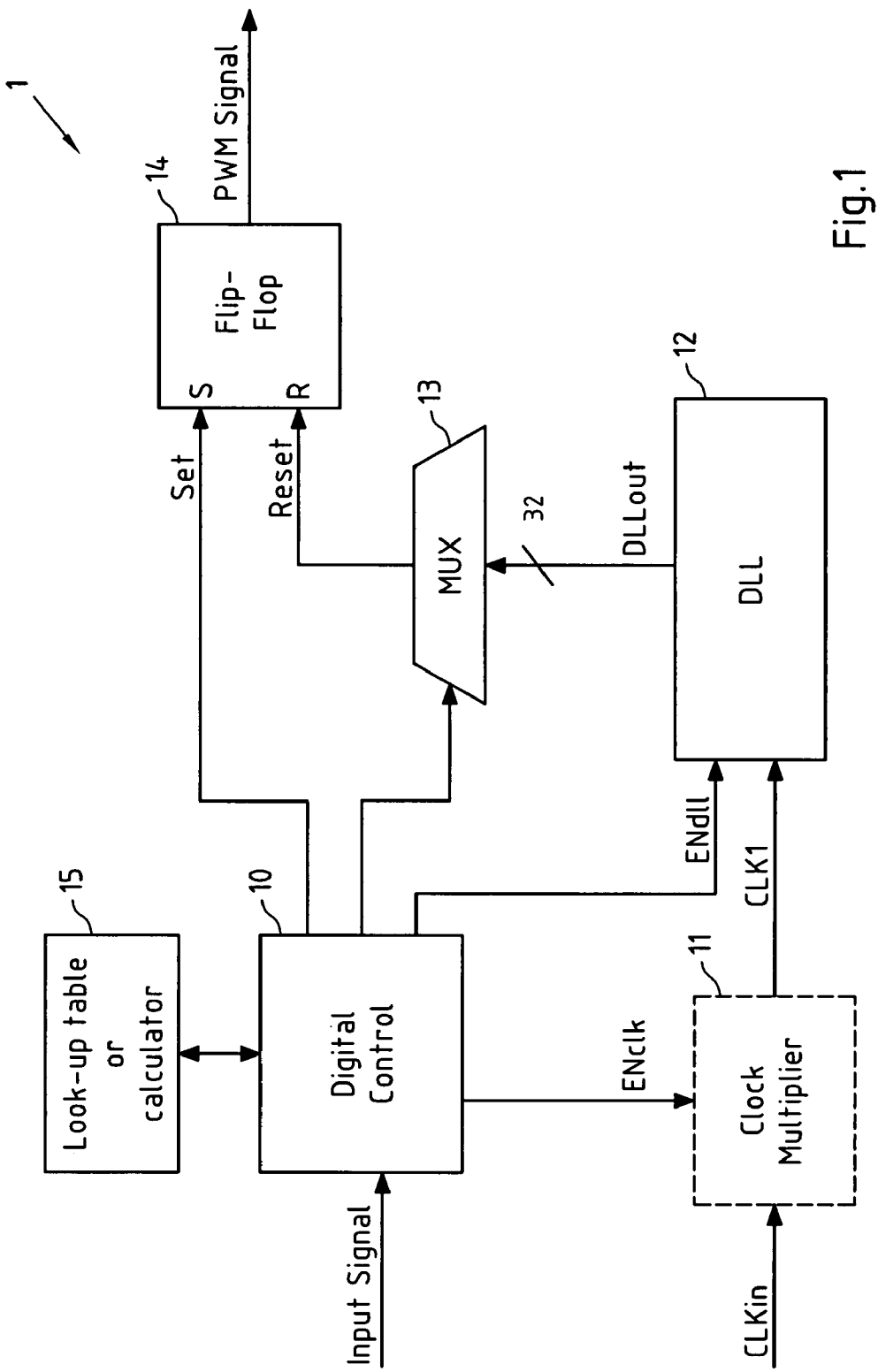
FIG. 1: A schematic block diagram of an exemplary embodiment of a device for generating a pulse-width modulated signal according to the present invention.

In the following detailed description of the present invention, exemplary embodiments of the present invention will be described in the context of a switching regulator, such as a Switched-Mode Power Supply (SMPS) with digital feedback. It is however to be noted that the present invention relates to control of a delay-locked loop in general and is not limited to application in the context of digital pulse-width modulation, and is consequently not limited to application in digital-pulse width modulation in a digital feedback loop of an SMPS.

The control of a delay-locked loop according to the present invention can be used to improve the efficiency of a switching regulator (like an SMPS) that uses digital feedback based on a delay-locked loop. Because of the poor efficiency the switching regulator wastes some energy taken from the battery, resulting in reduced battery lifetime.

Digital feedback uses digital pulse-width modulation (DPWM), which consumes a lot of power, when the switching frequency (the frequency at which switches are operated to generate the DPWM) and the high-frequency clock used to generate the DPWM are high.

The Direct Current (DC) output voltage accuracy in a digital feedback controlled SMPS, which may be understood as the smallest voltage step with which the output voltage of the SMPS can be adjusted, depends on the ratio between the switching frequency of the switching regulator and the high-frequency clock used to generate the DPWM. Also other parameters, like the input and the output voltage effects on the output DC accuracy.

If a high DC output voltage accuracy is desired, the high frequency clock would have to be increased based on the system parameters. Reducing the lost power would render digital feedback controlled SMPSs more interesting for various applications, such as for instance deployment in portable devices.

In DPWM, a high-frequency clock signal can be used to generate a high-resolution DPWM. Therein, the DPWM resolution is related to the duty-cycle of the DPWM. A high-resolution DPWM allows for a high DC output voltage accuracy, since the DC output voltage accuracy is based on the DWPM resolution (and may also be based on further parameters such as for instance the regulator topology and the input and/or output voltage levels). This implementation however consumes much power typically, when the high-frequency clock is by a factor of 200-2000 times higher than the used switching frequency.

An alternative approach could be to use delay cells to generate a high-resolution DPWM with or without a Delay-Locked Loop (DLL). However, the power consumption may then be too high, or the linearity of the system may be too low for mobile devices, which require a very high-resolution output. To save power, thus only a lower switching frequency could be used to reduce the demands for the DPWM resolution, then of course leading to reduced DC output voltage accuracy.

The present invention, when deployed in the context of DPWM in a digital feedback loop of an SMPS, enables a higher DC output voltage accuracy by increasing the DPWM resolution and increasing the high-frequency clock with only small extra power. This leads to a low-power high-resolution DPWM. The higher DPWM resolution also reduces the size of the external coil and capacitor of the SMPS (see FIG. 2) and makes the transient response faster, which is already available in analog feedback applications.

According to one embodiment of the present invention, which is schematically depicted in FIG. 1 (with optional clock multiplier/DLL 11 not being used), and which will be described in more detail below, power consumption can be reduced by turning on and off DLL 12. It is important how to turn on and off DLL 12 so that the start-up time of DLL 12 can be minimized. Hence DLL 12 could be turned off as long as possible to save power. The start-up is done by turning on first a clock for a delay element chain (reference numerals 63-1 to 63-32 in FIG. 6) of DLL 12, and a phase detector (reference numeral 61 in FIG. 6) of DLL 12 is turned on after the delayed clock has arrived to the phase detector after for instance one to two input clock periods. This may allow turning the phase detector off for 80-95% of the time, depending on the required output resolution and the clock generation characteristics.

According to another embodiment of the present invention, which is also schematically depicted in FIG. 1 (but now with optional clock multiplier/DLL 11 being used), to reduce power consumption, a first DLL 11 is used to multiply the input clock, and a second DLL 12 is properly turned on and off as in the aforementioned embodiment. The total current consumption can then be optimized by adjusting two parameters: the multiplication factor of the first DLL 11 and the operation time of the second DLL 12.

Figure 2:
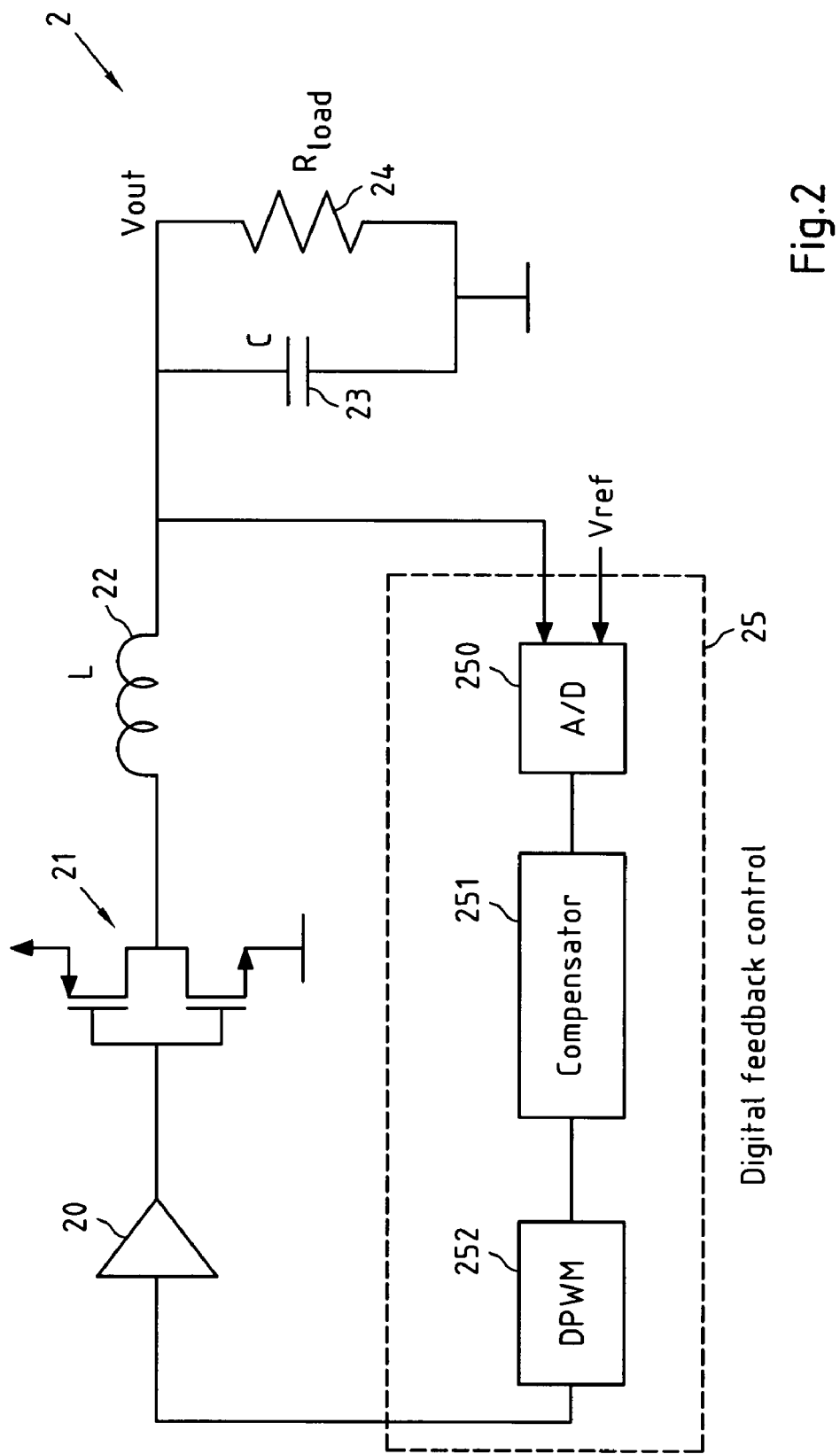
FIG. 2: a schematic block diagram of an exemplary embodiment of a digital feedback controlled switched-mode power supply according to the present invention.

An exemplary use case of the present invention may be a digital feedback controlled SMPS, as exemplarily shown in FIG. 2, where the next time DLL 12 (in DPWM unit 252 of FIG. 2) is required to be on can be estimated very accurately. Hence DLL 12 is turned on just before the output of that DLL 12 is required for the next phase, and with this system the required settling time for the DLL 12 is very short.

If DPWM according to the present invention was not applied, the current consumption would be too high to enable the use of SMPS with digital feedback for instance in mobile devices.

FIG. 1 depicts a schematic block diagram of an exemplary embodiment of a device 1 for generating a pulse-width modulated signal according to the present invention. Device 1 comprises a digital control unit 10, a DLL 12, a multiplexer 13 and an RS-Flip-Flop 14. As already stated above, clock multiplier/DLL 11 is optional. In the following, functioning of an embodiment that deploys clock multiplier/DLL 11 will be considered.

Clock multiplier/DLL 11 receives a clock signal CLKin, e.g. from a clock generator, and increases the clock frequency of CLKin by a factor 4 to obtain a clock signal CLK1. For instance, if a clock frequency of CLKin was 38.4 MHz, a clock frequency of CLK1 would be 153.6 MHz. CLK1 is fed into DLL 12, which, under control of digital control unit 10, generates 32 outputs DLLout that are multiplexed by multiplexer 13 to obtain a switching signal termed "Reset", which is fed into the R input of RS-Flip-Flop 14. Digital control unit 10 outputs a switching signal termed "Set", which is fed into the S input of RS-Flip-Flop 14. Based on these two switching signals, RS-Flip-Flop 14 generates a PWM signal. Digital control unit 10 may further output a control signal ENclk to control operation of clock multiplier/DLL 11, and a control signal to control multiplexer 13. Digital control unit 10 interfaces with a look-up table or calculator 15, which will be explained below. Operation of the digital control unit 10 is at least partially based on an input signal, which will be explained in more detail below. Furthermore, digital control unit 10 may additionally implement functionality of a compensator (for instance of compensator 251 of FIG. 2).

A target of the device 1 of FIG. 1 is to produce high-resolution signal edges of the PWM signal with a low-power structure. Hence DLL 12 producing 32 different clock edges can be turned off, when it is not required to be in operation by the control signal ENdll. Therefore DLL 12 can for instance be off even over 90% of time and it is turned on just before the DLL outputs are required for multiplexer 13.

The principle of DPWM as explained with reference to FIG. 1 in a feedback loop of a buck SMPS 2 according to an embodiment of the present invention is presented FIG. 2. The digital feedback control 25 includes an Analog-to-Digital (A/D) converter 250, a digital compensator 251 and a DPWM generator 252. The further blocks are the same as used in an analog feedback buck SMPS, i.e. an amplifier 20, electronic switch 21 (comprising a PMOS transistor and an NMOS transistor), coil 22, capacitor 23 and load 24. Therein, the output signal of A/D converter 250 serves as an input signal for digital control unit 10 of FIG. 1, and the output of RS-Flip-Flop 14 of FIG. 1 constitutes the output of DPWM unit 252 of FIG. 2. In FIG. 2, the PMOS transistor and the NMOS transistor in electronic switch 21 may equally well be driven by two separate buffers replacing element 20 to improve the efficiency. These two buffers may have a signal edge difference in time, for instance less than 1 ns. The buck SMPS 2 of FIG. 2 may then comprise a further analog block between elements 252 and 20, which analog block generates two different signals for the two buffers that drive the PMOS transistor and NMOS transistor in electronic switch 21.

Compensator 251 in the exemplary embodiment of FIG. 2 uses either pre-calculated look-up table values or real-time calculation (as provided by unit 15 in FIG. 1) to process values received from A/D converter 250 in order to keep operation of SMPS 2 stable. Stability may be an issue since output has double poles, which are generated by the coil 22 and capacitor 23.

For instance, the A/D converter 250 may compare the output voltage of the system with a reference voltage that is the target value for the output voltage. If the output voltage of the system is near the target level, the A/D converter gives an error code, e.g. "0". If the output of the system is below or above the target output voltage range, the A/D converter may give an error code, for instance "−1", "−2", "−3" . . . or "+1", "+2", "+3" etc. This A/D converter result may be used by compensator 251 to adjust the duty cycle of the system.

Figure 3:
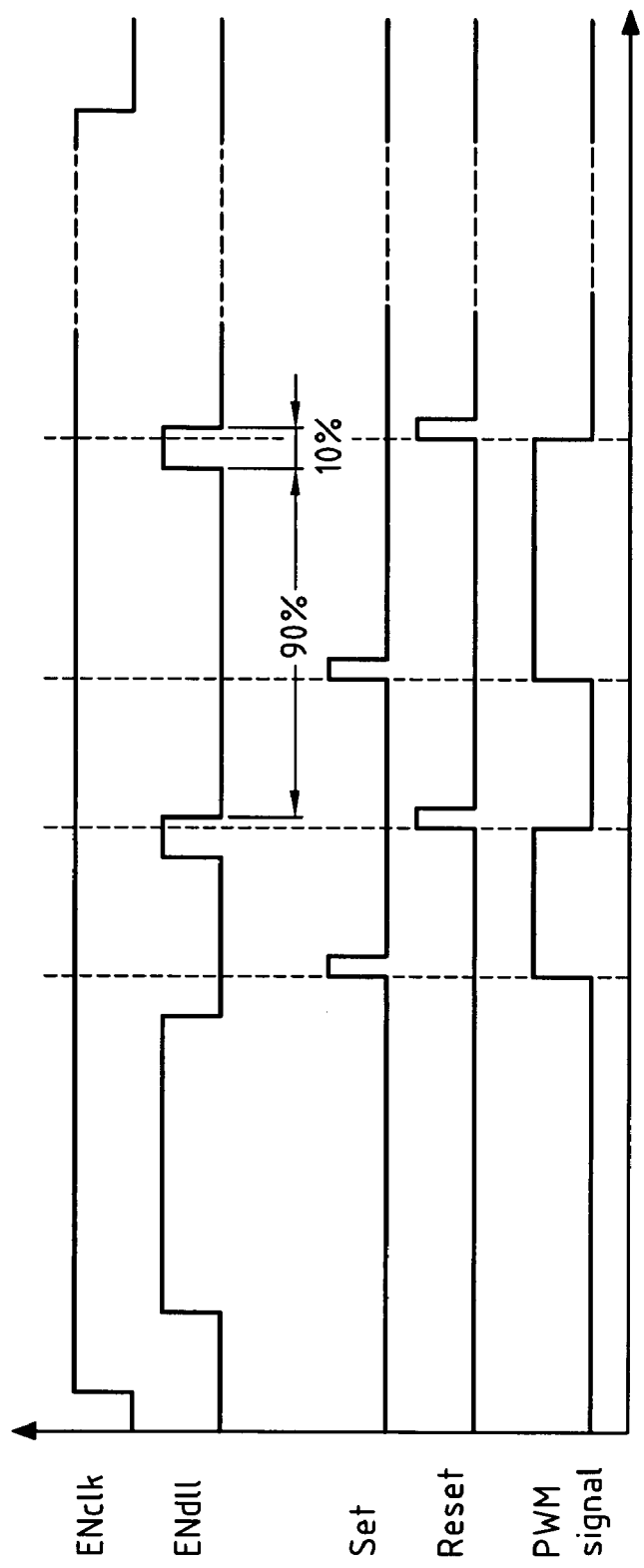
FIG. 3: a diagram illustrating the timing of various signals in the embodiment of FIG. 1.

The timing of the various signals exchanged between the blocks of the device of FIG. 1 is illustrated in FIG. 3. As can be seen from the uppermost time line, the signal ENclk for controlling operation of the clock multiplier/DLL 11 of FIG. 1 is set to 1 for basically the entire time. In contrast, the control signal ENdll used by the digital control unit to turn on and off DLL 12 is, after an initial phase, only set to 1 shortly before each falling edge of the PWM signal (see the lowermost time line), and is set to 0 after each falling edge of the PWM signal. This results in DLL 12 being turned off for approximately 90% of the time, as illustrated in the time line of ENdll. It is readily understood that even higher off-times can be achieved, such as for instance 95%, and that off-times may also be lower, as for instance 70 or 80%. It can further be seen from FIG. 3 that each time the signal ENdll is set to 1, generation of a tooth of the Reset signal being fed to the R input of RS-Flip-Flop 14 of FIG. 1 is triggered, which in turn triggers generation of a falling edge of the PWM signal. The rising edges of the PWM signal are triggered by the Set signal output by digital control unit 10 of FIG. 1. The Set signal may for instance be triggered by the control unit 10 at the same time in each switching period, i.e. at the switching frequency of the DPWM. The falling edge may then be assumed to be late enough to give ample time for the A/D converter and compensator. Adjustment of the duty cycle of the DPWM then may be controlled by the falling edges only, which may contribute to increase stability of the system. Of course, equally well the time of occurrence of falling edges may be kept constant, and the duty cycle could then be controlled by triggering the rising edges, or both rising and falling edges could be controlled to control the duty cycle.

Figure 4:
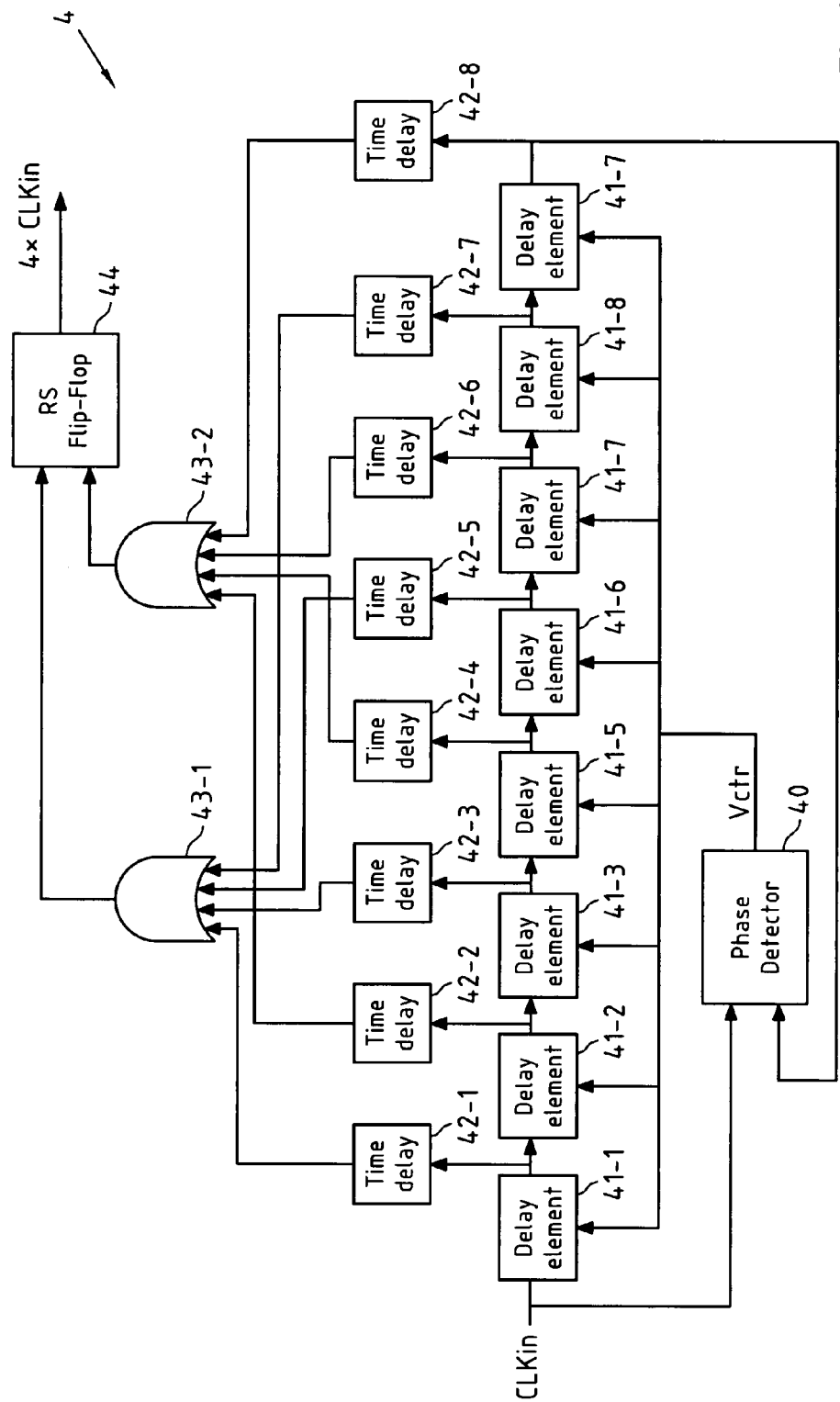
FIG. 4: a block diagram of an exemplary clock multiplier for the embodiment of FIG. 1.

FIG. 4 is a block diagram of an exemplary embodiment of a clock multiplier 4 that may be used as clock multiplier/DLL 11 in the embodiment of FIG. 1. The clock multiplier is based on a DLL, which comprises a line of eight delay elements 41-1 to 41-8, a phase detector 40 that compares the clock signal CLKin at the input of the line of delay elements and the delayed clock signal at the output of the line of delay elements (for instance by detecting the phase differences between the edges of both signals) and outputs a control voltage Vctr that is used to control the delay elements 41-1 to 41-8, time delay elements 42-1 to 42-8, two combination units 43-1 and 43-2 and an RS-Flip-Flop 44. Clock multiplier 4 can produce a four times higher frequency clock.

As already stated above, if the optimal clock signal is already available, the clock multiplier may be dispensed with, but for best efficiency (i.e. for smallest power consumption) the input clock signal CLKin might need the multiplication, which also might be something else than four (two, eight or even higher). In the present exemplary embodiment, clock multiplier 4 is used since an optimal balance between the CLKin (see FIG. 1) and CLK1 was required to minimize the total power consumption of the system. The multiplied clock frequency depends on several different parameters on the system. In the present exemplary embodiment, a 153.6 MHz clock signal has been chosen based on the best guess. The clock multiplication can be higher or smaller, depending on the total power consumption of the system.

Figure 5:
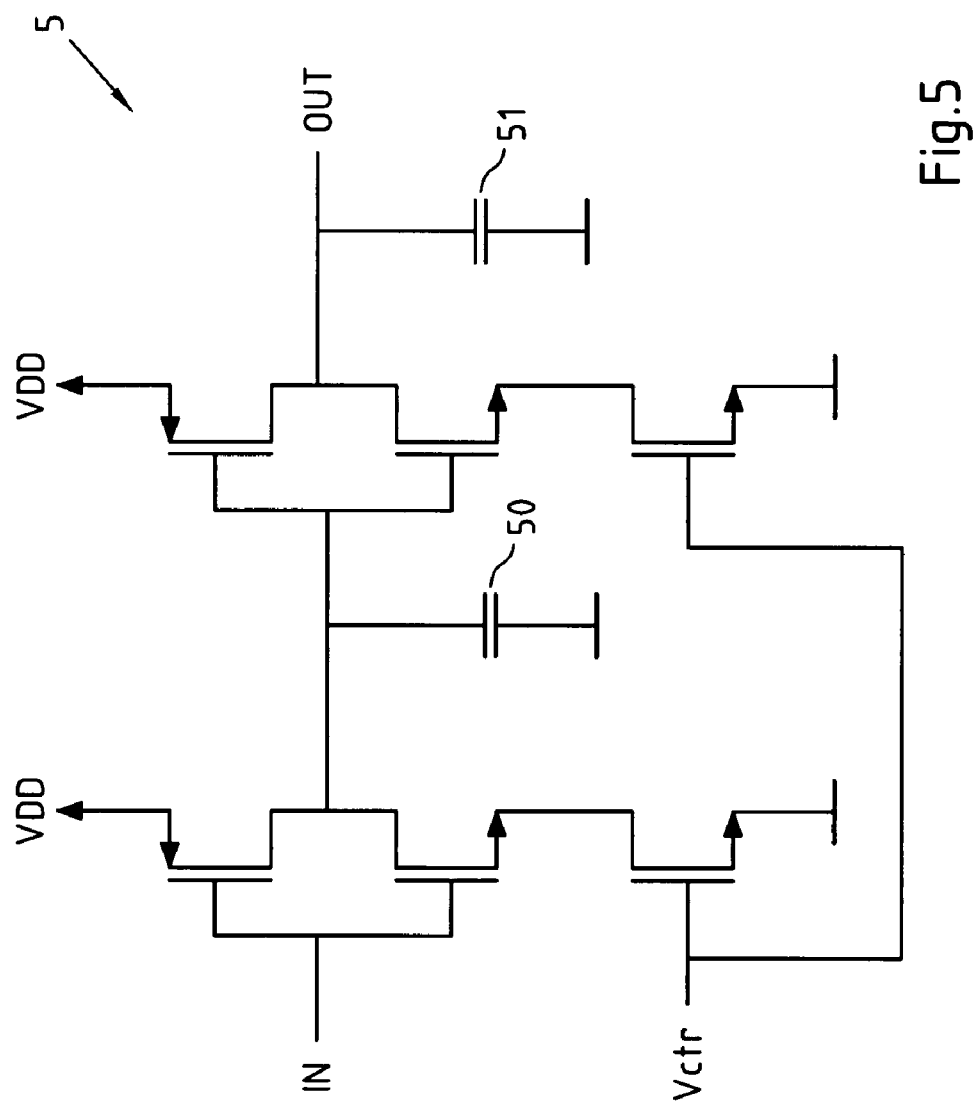
FIG. 5: a circuit diagram of the delay elements used in the clock multiplier of FIG. 4.

A circuit diagram of an exemplary delay element 5 that may be used as delay element 41-1 to 41-8 in clock multiplier 4 of FIG. 4 is shown in FIG. 5. Delay element 5 consists of a plurality of transistors and two capacitors 50 and 51. Delay element 5 consumes power to charge and discharge capacitors 50 and 51, wherein a capacity of capacitors 50 and 51 may for instance be around 50-80 fF. Instead of delay element 5, equally well for instance delay cell 8 of FIG. 8 could be used as delay element 41-1 to 41-8 in clock multiplier 4 of FIG. 4.

Figure 6:
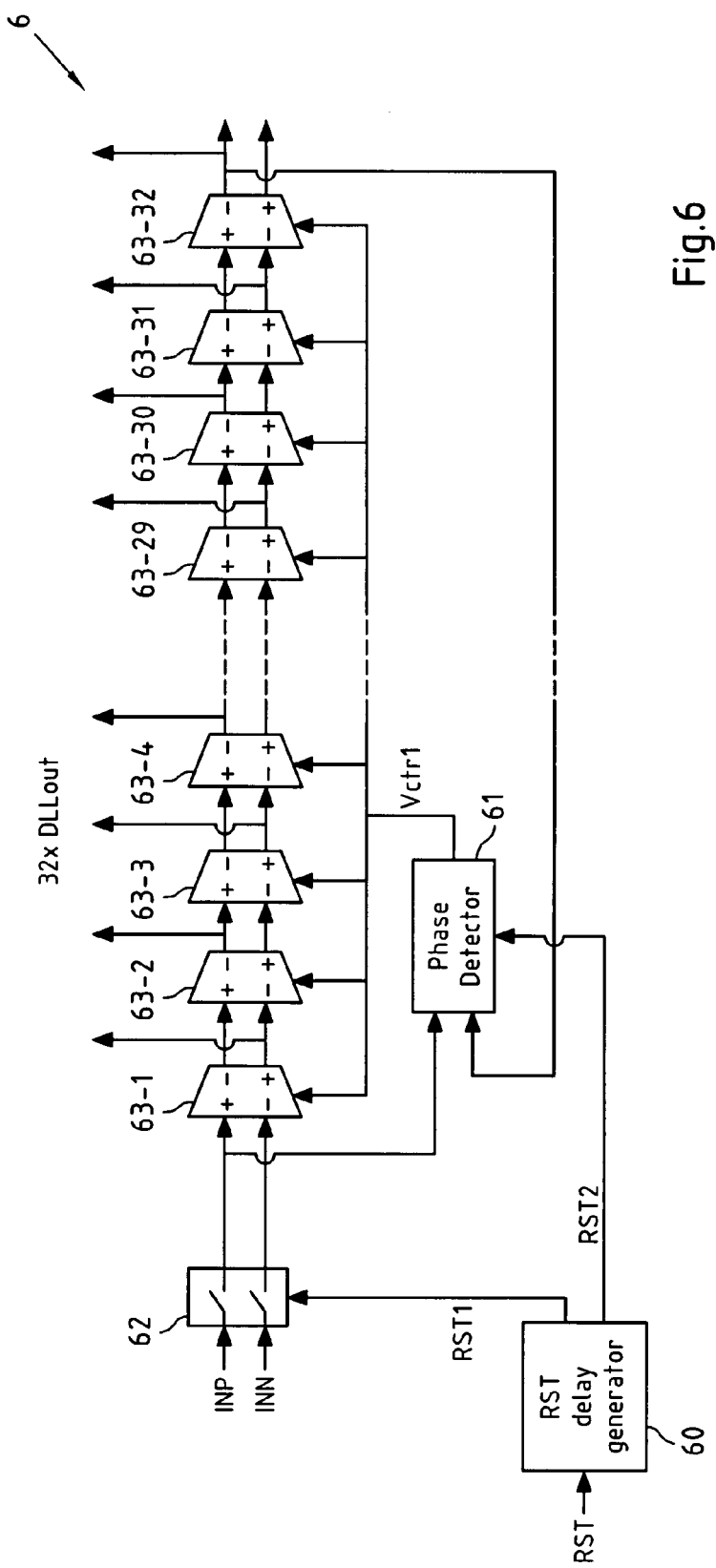
FIG. 6: a block diagram of an exemplary delay-locked loop for the embodiment of FIG. 1.

FIG. 6 is a block diagram of an exemplary embodiment of a DLL 6 that may be used as DLL 12 in the embodiment of FIG. 1. DLL 6 comprises a line of differential delay elements 63-1 to 63-32, an input switch 62 for applying a differential representation of clock signal CLK1 to the line of delay elements 63-1 to 63-32, a phase detector 61 for comparing a representation of clock signal CLK1 tapped before the first delay element 63-1 and a delayed representation of clock signal CLK1 tapped after the last delay element 63-32 (for instance by detecting the phase differences between the edges of both signals) and outputting a control voltage Vctr1 to control the delay elements 63-1 to 63-32, and a unit 60 for controlling input switch 62 and phase detector 61 via control signals RST1 and RST2 determined based on a control signal RST. In the present exemplary embodiment, control signal RST corresponds to signal ENdll of FIG. 1. Alternatively, the signals RST1 and RST2 could also be generated by control unit 10 of FIG. 1 directly.

The use of differential delay elements 63-1 to 63-32 may lead to an improved driving capability. Furthermore, only one inverter may then be used in the signal path and the outputs are then similar for multiplexer 13 (see FIG. 1). Hence the delay variation should be small between the positive and negative outputs of the delay elements. If non-differential (single-output) delay elements were used, two inverters may be required in series to guarantee optimal delay in each delay element. The time of propagation in the inverter depends on the input signal edge, be it falling or rising edge. Two inverters in series may limit the fastest available propagation delay in each delay element. A differential delay element has clock and inverted clock signal available between two elements, wherein either of them is chosen for multiplexer 13 (see FIG. 6).

The high-resolution signal edges of the PWM signal in FIG. 1 are produced by DLL 12. DLL 12 produces 32 output signals with 0.203 ns delays between two outputs next to each other, if the input clock is 153.6 MHz. The 0.203 ns delay is equivalent to approximately 5 GHz digital clock for the DPWM.

Simulations with 1.8V transistors have shown that, if the DLL 12 would be turned on all the time, it would consume a current of approximately 1.7-1.8 mA.

However, according to the present invention, DLL 12 can be turned off right after the falling edge of the digital PWM (see FIG. 3). For instance, if the PWM frequency is 3.2 MHz, one PWM period is 312.5 ns. Due to the compensator, the next falling edge of the PWM will arrive approximately after 305 ns to 320 ns due to the compensator. Hence it is not useful to consume power during this time, and DLL 12 can be turned off.

In the exemplary embodiment of DLLs 6 according to FIG. 6, it may not be important if the positive output of the first delay element 63-1 and then the negative output of the second delay element 63-2 is used (and correspondingly continuing in alternating fashion for the further delay elements 63-3 to 63-32) or if the negative output of the first delay element 63-1 and the positive output of the second delay element 63-2 is used (and correspondingly continuing in alternating fashion of the further delay elements 63-3 to 63-32).

In the exemplary embodiment of DLL 6 according to FIG. 6, also single ended (non-differential) elements may be used. For instance, then the delay elements of FIG. 5 may be used.

In the exemplary embodiment of DLL 6 according to FIG. 6, input switch 62 may for instance be replaced by digital gates or other elements that can be controlled to reject the input signal(s) going further to the chain of delay elements. Since the power consumption may mainly happen in the delay elements, it is advisable to turn off the input to the chain of delay elements during time the DLL is unused.

Figure 7:
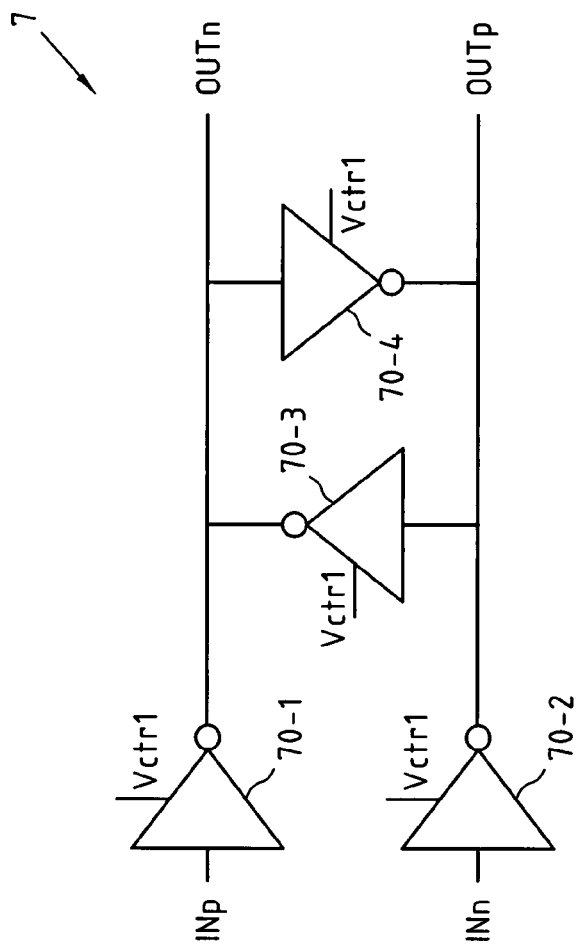
FIG. 7: a block diagram of exemplary differential delay elements for the delay-locked loop of FIG. 6.

FIG. 7 is a block diagram of an exemplary embodiment of a differential delay element 7 that may be used as differential delay element 63-1 to 63-32 in the DLL 6 of FIG. 6. Delay element 7 consists of an interconnection of delay cells 70-1 to 70-4, which can be controlled via control voltage Vctr1.

Figure 8:
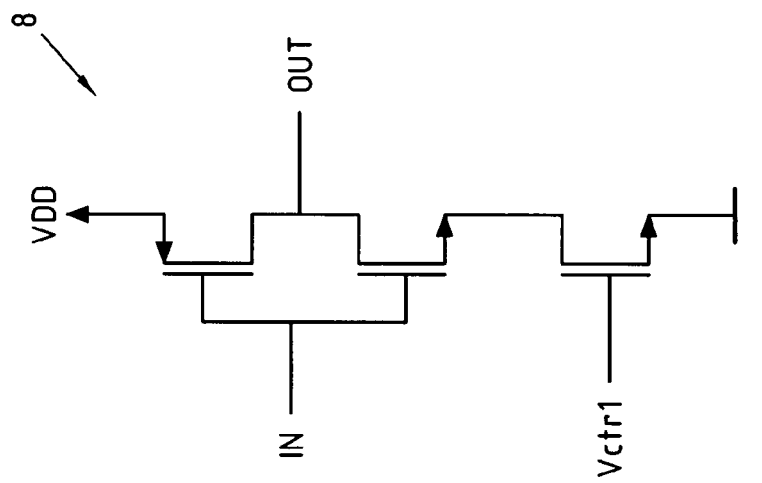
FIG. 8: a circuit diagram of exemplary delay cells for the differential delay elements of FIG. 7.

FIG. 8 depicts a circuit diagram of an exemplary embodiment of a delay cell 8 that may be used as delay cell 70-1 to 70-4 of the delay element 7 of FIG. 7.

Figure 9:
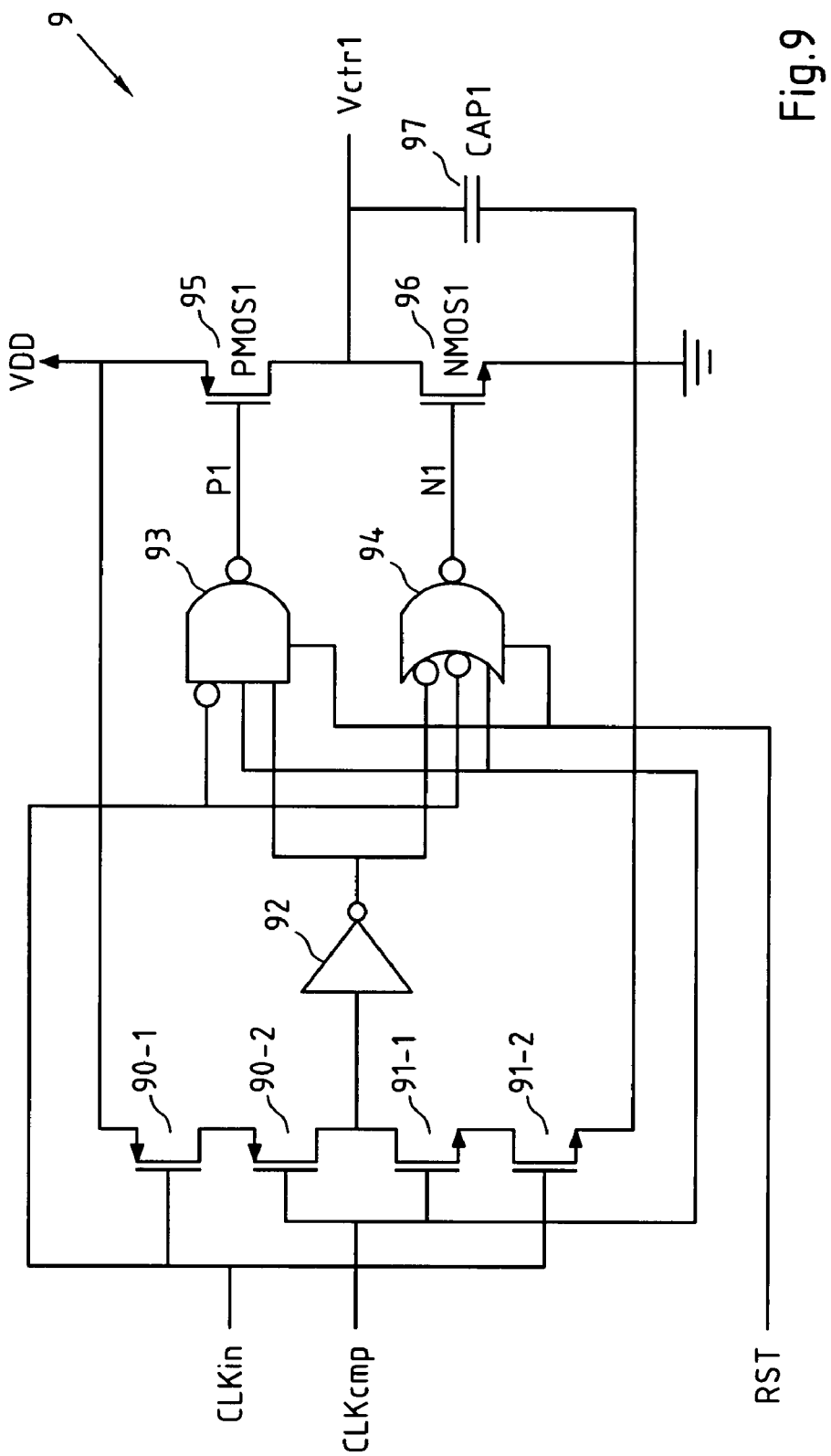
FIG. 9: a circuit diagram of an exemplary phase detector for the delay-locked loop of FIG. 6.

FIG. 9 depicts a circuit diagram of an exemplary embodiment of a phase detector 9 that may be used as phase detector 61 in the DLL 6 of FIG. 6. As already described, phase detector 9 compares two delayed representations of clock signal CLK1, which are denoted as CLKin and CLKcmp in FIG. 9, and outputs a control voltage Vctr1. Phase detector 9 can be controlled by control signal RST2. To this end, phase detector 9 comprises a plurality of transistors 90-1, 90-2, 91-1, 91-2, 95 and 96, an amplifier 92, logic gates 93 and 94, and a capacitor 97.

The problem how to shut down DLL 12 of FIG. 1 so that it can be woken up very rapidly is solved by generating two signals RST1 and RST2 from reset signal RST (see FIG. 6). This is accomplished by unit 60 of DLL 6 in FIG. 6, which is denoted as RST delay generator in FIG. 6.

Both reset signals RST1 and RST2 can be turned '1' at the same time, this turns the phase detector 61 of DLL 6 off immediately. This timing of RST1 and RST2 (as well as the differential input of DLL 6, represented by signals INP and INN) is illustrated in the left-hand part of FIG. 10.

As visible from FIG. 9, the PMOS1 and NMOS1 transistors 95 and 96 are turned off, when RST='1'. In this mode, node P1 is connected to the positive supply voltage VDD, and node N1 is connected to the ground, and both transistors, PMOS1 and NMOS1 are not in the conducting mode. Hence capacitor CAP1 97 stores the correct control voltage Vctr1 for the period DLL 12 is not used. Voltage Vctr1 is between VDD (or another supply voltage) and ground at a level, where the delays of the delay elements are locked on the correct frequency, for instance in a way that the total delay of all delay elements 63-1 to 63-32 in DLL 6 (see FIG. 6) corresponds to one input signal period or a multiple thereof. Depending on the design, the total delay may also deviate from one input signal period or from multiples thereof.

Figure 10:
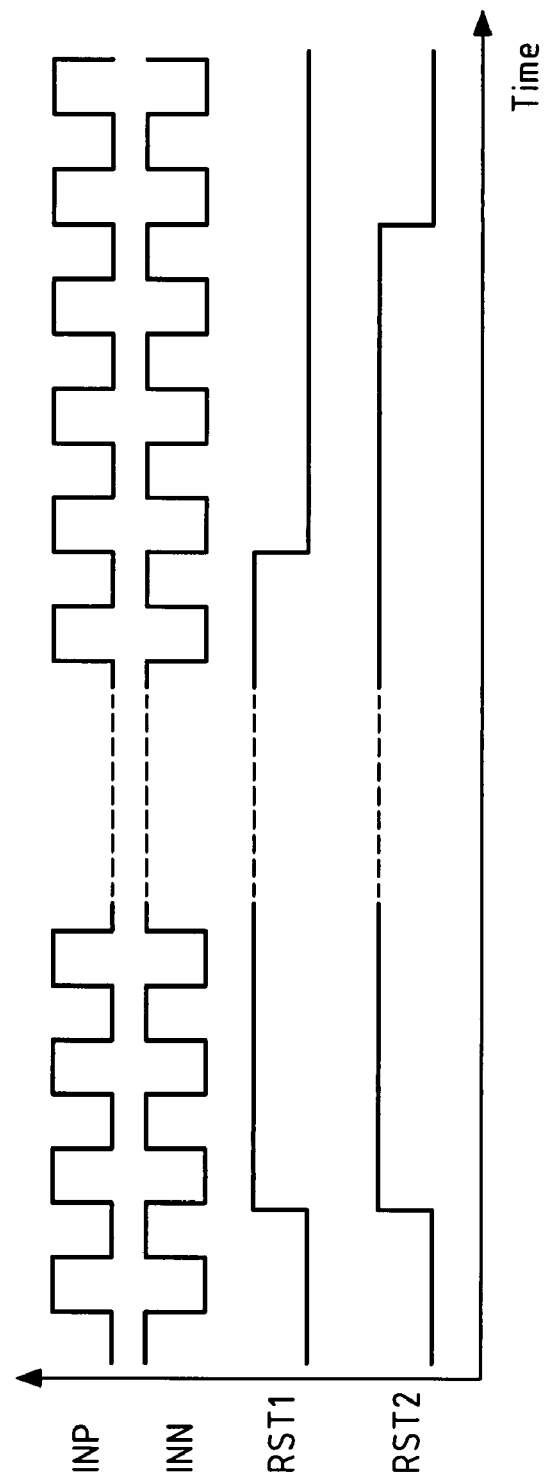
FIG. 10: a diagram illustrating the timing of various signals in the delay-locked loop of FIG. 6.

When DLL 12 is turned on, for instance 20 ns-30 ns before the next falling edge of the PWM (see FIG. 3), reset signal RST1 (see FIG. 6) is turned '0' before reset signal RST 2 is turned '0', as illustrated in the right-hand part of FIG. 10. Note: When RST1='1', switch 62 is open, and when RST1='0', switch 62 is closed.

This delayed switching of reset signal RST2 with respect to reset signal RST1 is required because phase detector 61 in FIG. 6 requires both clock signals, the input clock CLKin and the comparable clock after the delay chain CLKcmp (see FIG. 9), to work correctly. RST2 may for instance be turned to '0' only when the signals INN and INP output by switch 62 have passed all delay elements 63-1 to 63-32. The delay elements 63-1 to 63-32 may be so fast that the input clocc has passed them before the RST2 signal is turned to '0'. Otherwise, phase detector 9 would start to charge or discharge CAP1 97, and the delay control voltage Vctr1 would be adjusted wrongly, which would increase the settling time remarkably. Hence reset signal RST2 may be turned to '0' after at least one clock signal has passed the delay chain of DLL 6 (see FIG. 6). This may for instance require 6-12 ns, when the 153.6 MHz input clock is fed into DLL 6.

Figure 11:
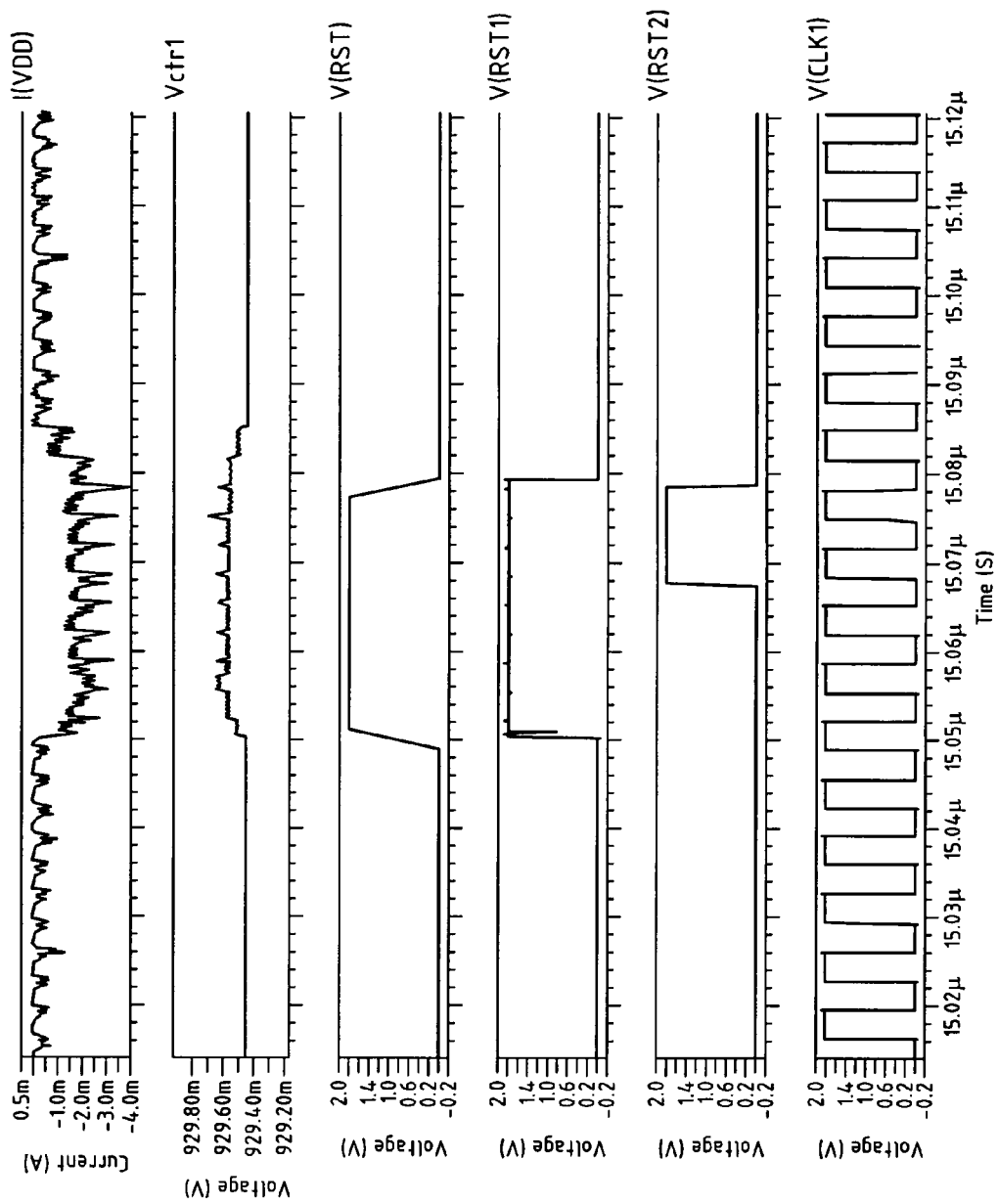
FIG. 11: a diagram illustrating current or voltage of various signals in the delay-locked loop of FIG. 6.
Figure 12:
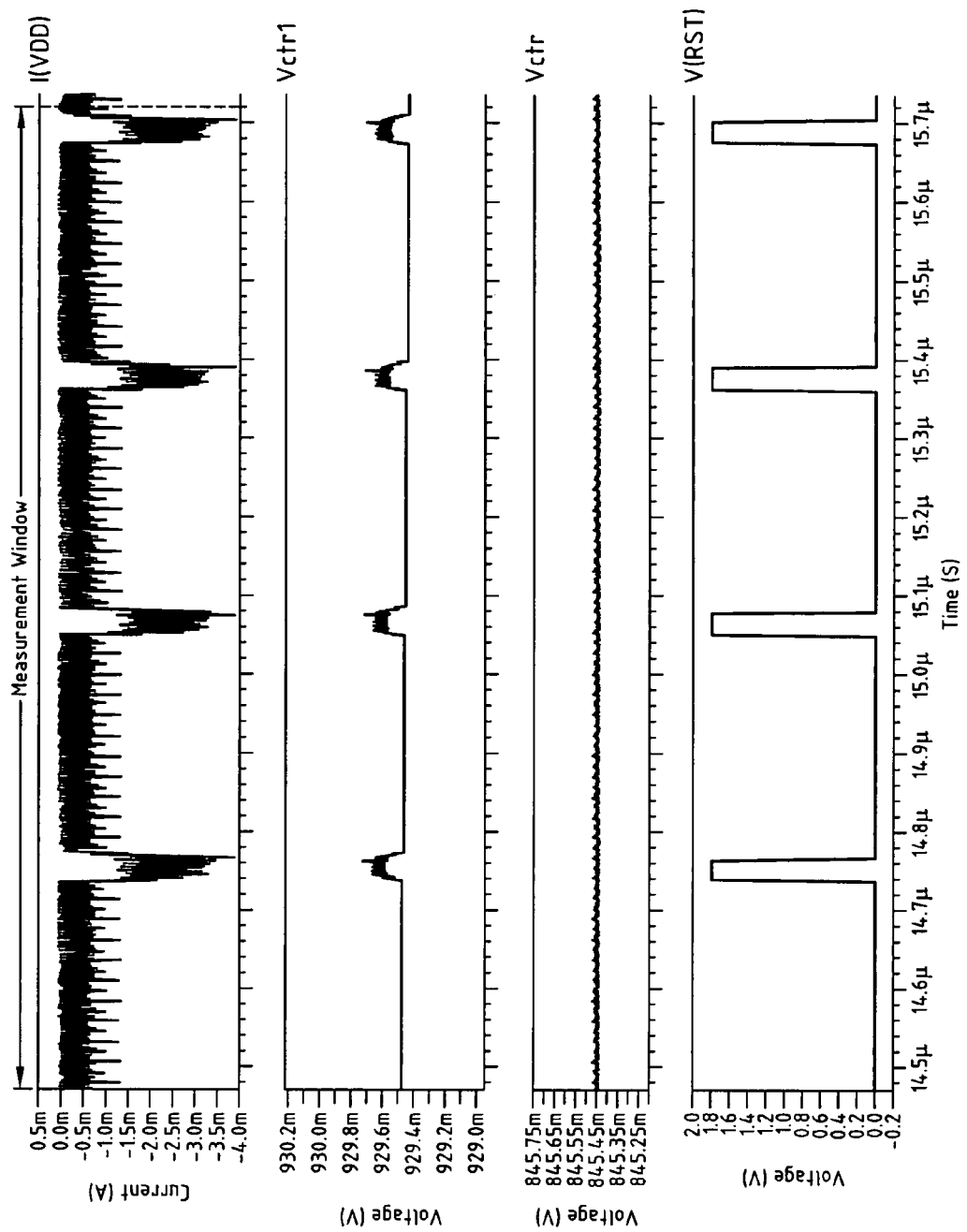
FIG. 12: a diagram illustrating current or voltage of various signals in the device of FIG. 1.

Results obtained by simulation of the clock multiplier/DLL 11 and DLL 12 of the device of FIG. 1 are shown in FIGS. 11 and 12. Therein, a zoomed time range is shown in FIG. 11, in which—from top to bottom—the supply current I(VDD), the control signal Vctr1 in DLL 12, the RESET signals V(RST), V(RST1) and V(RST2) in DLL 12 and the clock signal fed into the DLL 12 V(CLK1) (here exemplarily assumed to be 153.6 MHz) are presented.

As FIG. 11 shows, turning on phase detector 61 (see FIG. 6) does not cause any big error signal to the control voltage Vctr1, and therefore the settling time of DLL 12 is short. Also the current consumption is approximately 200 μA, when DLL 12 is turned off and clock multiplier/DLL 11 is on. During a time when also DLL 12 is turned on, the current consumption increases to 2 mA.

FIG. 12 presents simulation results for the current consumption over 4 PWM periods, giving an average current of 399 μA (indicated as a solid line in the topmost plot of FIG. 12). As stated above, the total current consumption would be almost 2 mA, if both blocks, i.e. clock multiplier/DLL 11 and DLL 12, would be turned on all the time. FIG. 12 also shows the control signal Vctr1 in DLL 12, the control signal Vctr in clock multiplier/DLL 11 and the control signal RST in DLL 12 (see FIG. 6). The control voltage Vctr of clock multiplier/DLL 11 (lowermost plot in FIG. 12) is stable, since it is turned on all the time. The control voltage Vctr1 of DLL 12 varies a little bit depending on whether DLL 12 is turned on or off.

FIGS. 13-17 are related to an alternative embodiment of a DLL 6' that may be used as DLL 12 in the embodiment of FIG. 1.

Figure 13:
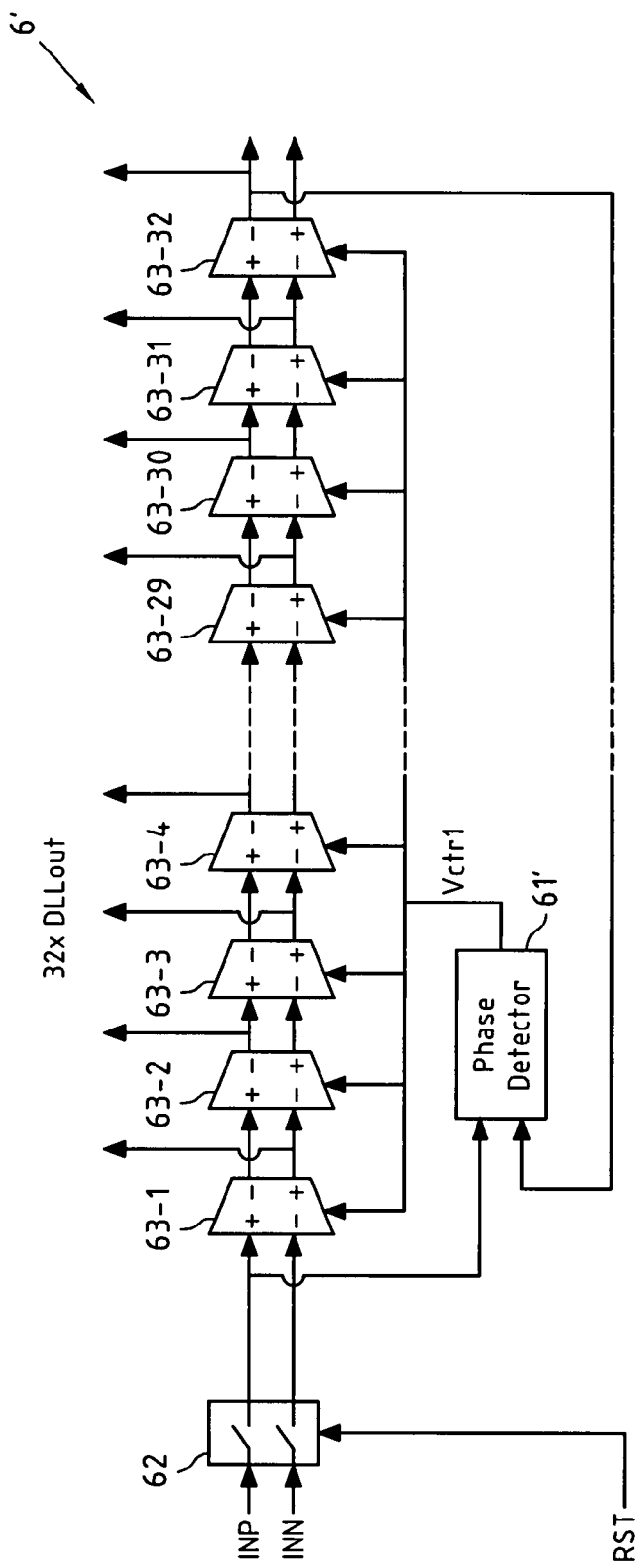
FIG. 13: a block diagram of a further exemplary delay-locked loop for the embodiment of FIG. 1.

Therein, FIG. 13 shows DLL 6', wherein—with respect to DLL 6 of FIG. 6—like element are denoted with like reference numerals. In DLL 6' of FIG. 13, control signal RST is directly applied to input switch 62, and no control signal is fed into phase detector 61', i.e. no unit for controlling input switch 62 and phase detector 61' is required. Control signal RST may for instance correspond to ENdll of FIG. 1.

Figure 14:
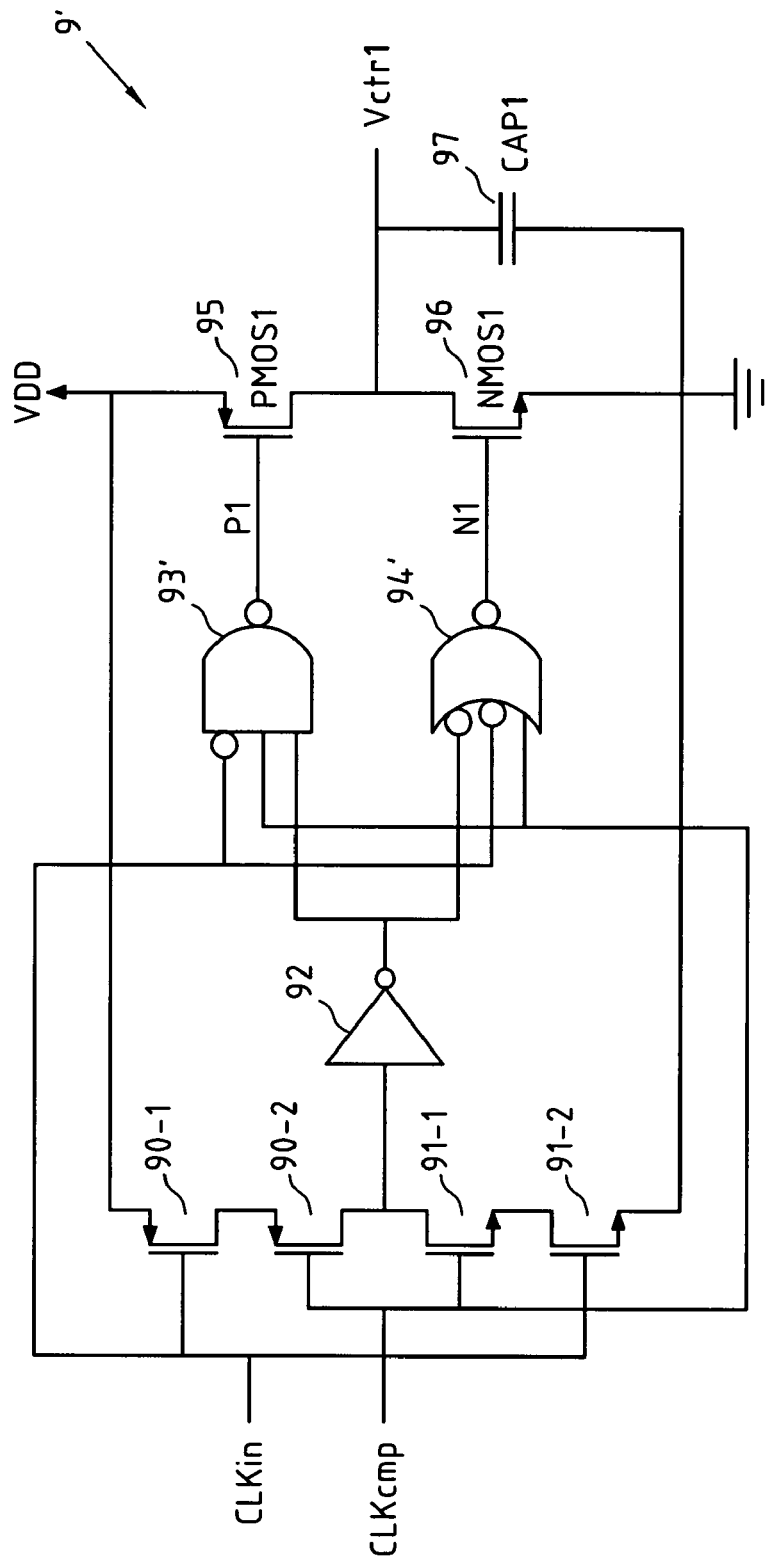
FIG. 14: a circuit diagram of an exemplary phase detector for the delay-locked loop of FIG. 13.

FIG. 14 a circuit diagram of an exemplary phase detector 9' that may be used as phase detector 61' in the delay-locked loop of FIG. 13, wherein—with respect to DLL 9 of FIG.

9—like element are denoted with like reference numerals. It is readily seen that phase detector 9' differs from phase detector 9 of FIG. 9 only in the feature that logic gates 93' and 94' of phase detector 9' do not comprise inputs for control signal RST.

In DLL 6' of FIG. 13, switch 62 is still used to turn the input clock on or off for the delay elements 63-1 to 63-32. Without input clocks edges, i.e. in case that the input of the first delay element 63-1 would be constant (either '0' or '1'), the delay elements would not consume power. Therefore switch 62 is used to disconnect delay element 63-1 from the input clock INP, when DLL 6' is turned off. Delay element 63-1 consumes power only, when its input changes from '0' to '1' or from '1' to '0'. The transistors may of course consume some power as leakage current flowing via them, but this leakage current may be negligible compared to power consumption in case of signal edges.

Figure 15:
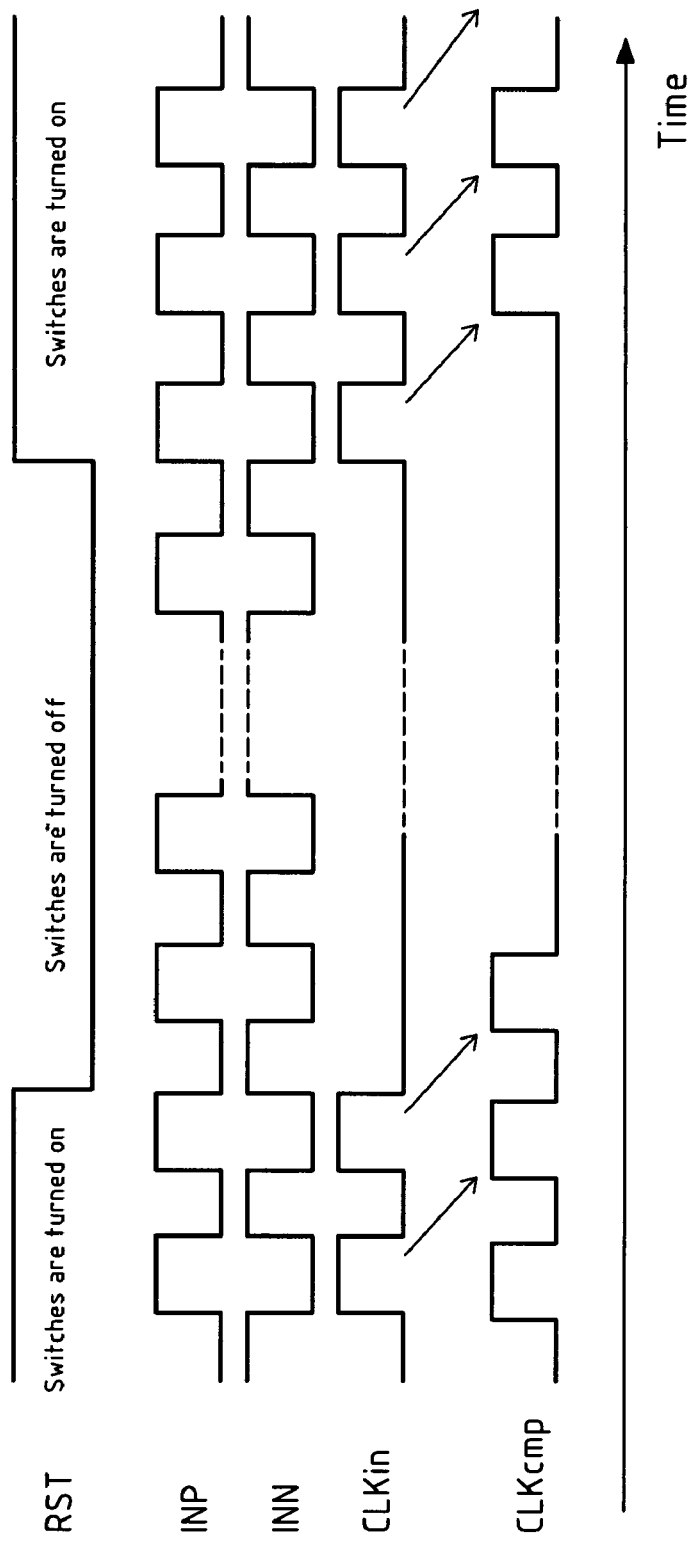
FIG. 15: a diagram illustrating the timing of various signals in the delay-locked loop of FIG. 13.

FIG. 15 is a diagram illustrating the timing of various signals in the delay-locked loop 6' of FIG. 13. In contrast to DLL 6 of FIG. 6 and the associated timing diagram of FIG. 10, now the RST signal is not used to generate two different control signals. The input clocks, INP (positive input clock, see FIG. 13) and the INN (negative input clock) are always on. When RST is '1', the positive input of delay element 63-1, which is also input into phase detector 61' (see signal CLKin in FIG. 14), follows the positive input clock INP with a very small delay. The signal output by delay element 63-32 is a delayed representation (in this case one clock period delay) of signal INP, which is also fed into phase detector 61' (see signal CLKcmp in FIG. 14). Hence when DLL 6' is turned off, the output of delay element 61-32 fed into phase detector 61' (signal CLKcmp) has one more signal period after the other signal fed into phase detector 61' (signal CLKin) is already zero.

Now, Phase detector 61' may for instance only be sensitive for the falling edges of signals CLKin and CLKcmp, if they arrive together. If only one of these input signals has a falling edge, phase detector 61' may not react, if the other input signal is '0' continuously. Hence the current state of the input signal is important, when DLL 6' (see FIG. 13) is turned on and off frequently.

Figure 16:
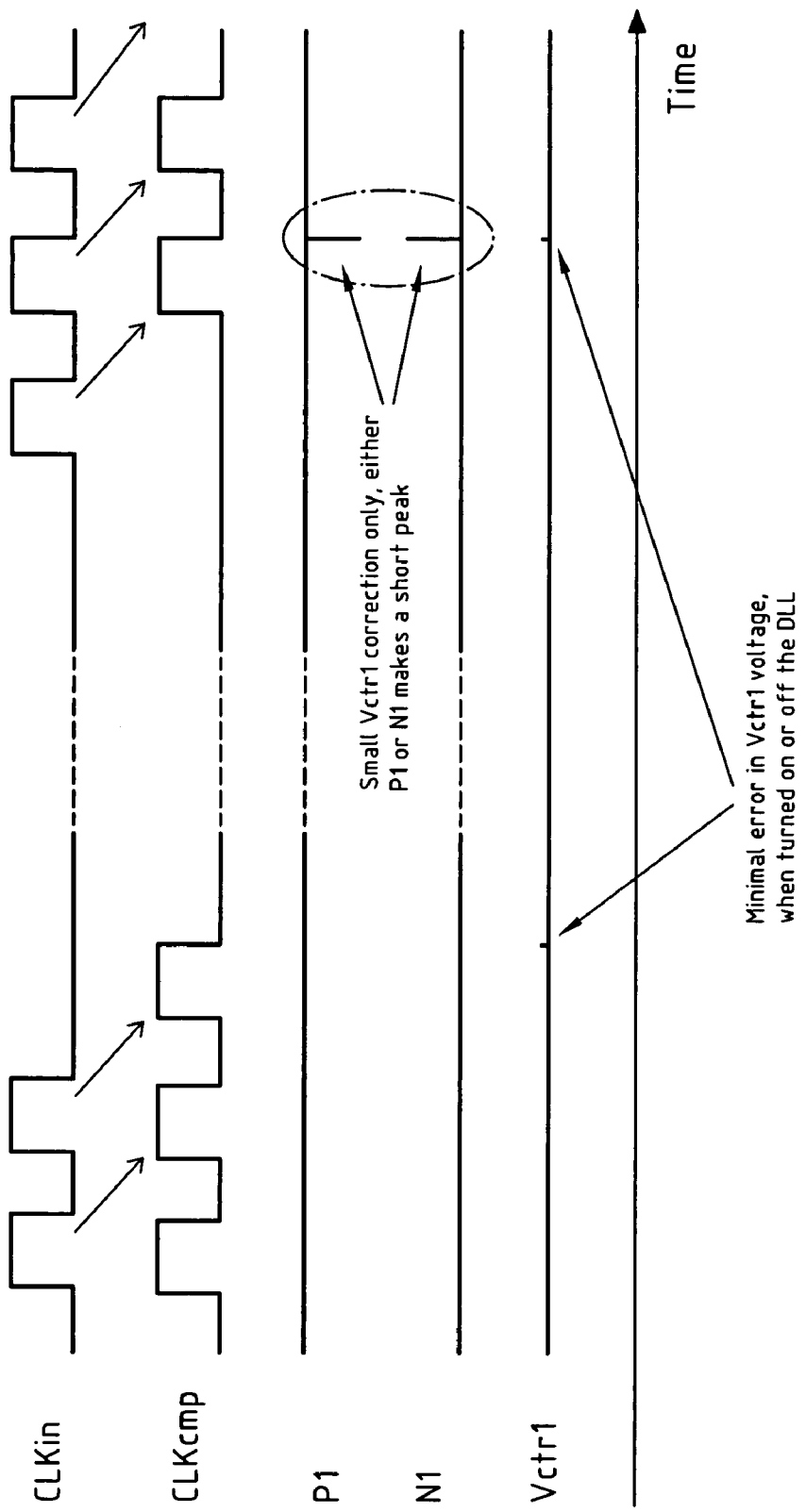
FIG. 16: a diagram illustrating the timing of various signals in the delay-locked loop of FIG. 13 for the case that the signal CLKin has the value '0' when the delay-locked loop is turned off.

In FIG. 16, the timing of the phase detector 61' is shown for the case that CLKin is '0', when DLL 6' is turned off. Since CLKin then is also '0', when DLL 6' is turned on again, the start-up of the DLL 6' should not cause any big error. The potential small control voltage error is corrected by the phase detector by the emphasized signal peaks in nodes P1 and N1 (see FIG. 14).

Figure 17:
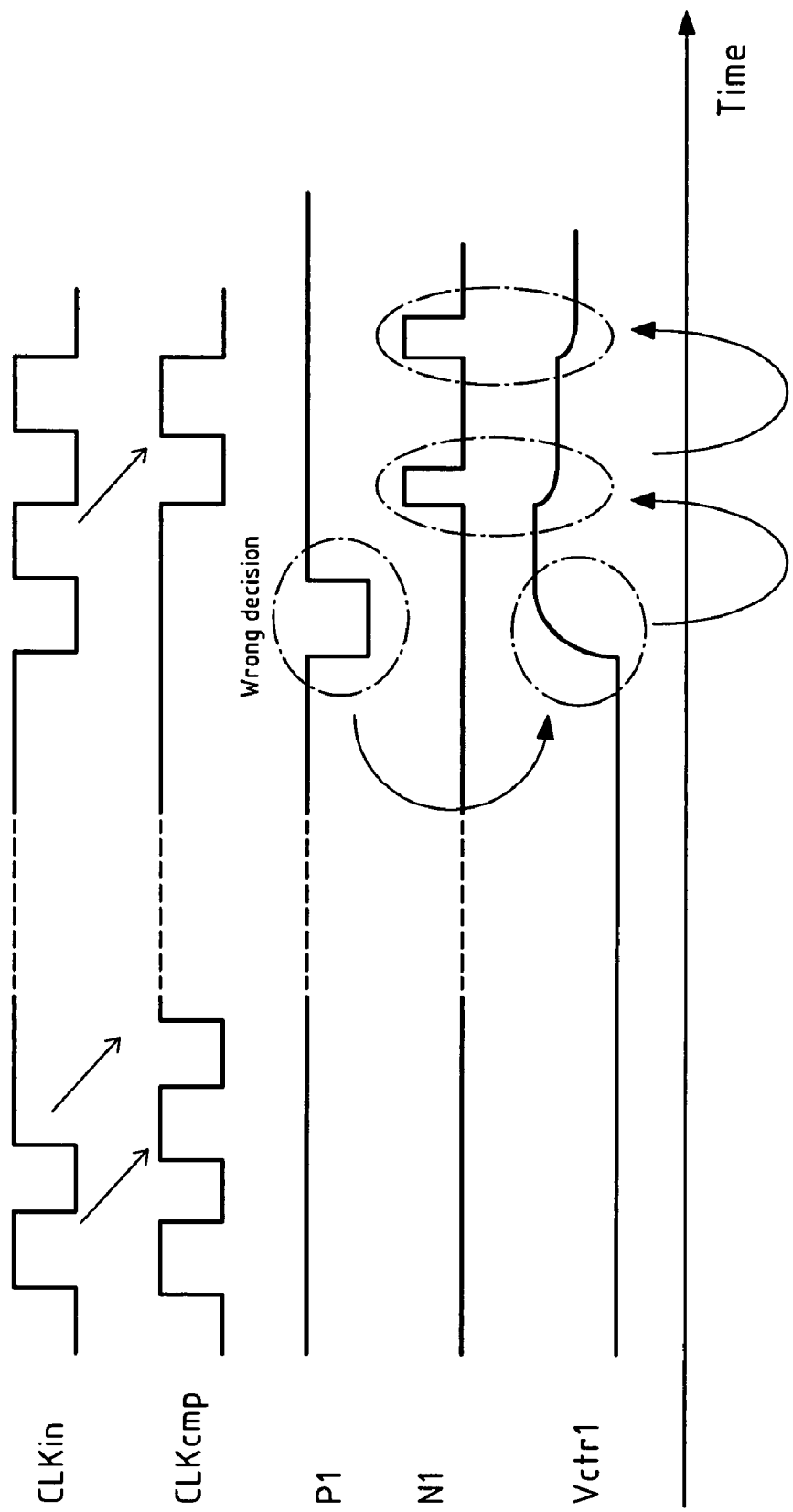
FIG. 17: a diagram illustrating the timing of various signals in the delay-locked loop of FIG. 13 for the case that the signal CLKin has the value '1' when the delay-locked loop is turned off.

In FIG. 17, the timing of the phase detector 61' is shown for the case that CLKin is '1', when DLL 6' is turned off. The restart of the DLL 6' causes a wrong decision inside the phase detector and the voltage of the node P1 opens the PMOS transistor 95 (see FIG. 14), for the same duration as the CLKin has the value of '0'. After one clock period delay, the CLKcmp will get the input signal and the phase detector starts to work properly.

As FIG. 17 illustrates, the long P1 pulse has charged the capacitor CAP1 and the control voltage Vctrl is now higher than in the locked case. The delay elements 63-1 to 63-32 in DLL 6' (see FIG. 13) are much too fast, and DLL 6' starts in the next falling edge of the signals CLKin and CLKcmp to adjust the delay by lowering the control voltage Vctrl in small steps. In this case, the steps are smaller than the first larger wrong adjustment of the control voltage Vctrl. Therefore it may take a long time until the original voltage level (and thus the original total delay of the chain of delay elements 63-1 to 63-32 in DLL 6') is achieved.

As should have become apparent from the above description, DLL 6' of FIG. 13 can be woken up properly when signal CLKin has the value '0' during (earlier) turning off of DLL 6'. This can be accomplished in a variety of ways. For instance, RST signal (signal ENdll in FIG. 1) may be generated by digital control unit 10 (see FIG. 1) in a way that DLL 6' is only turned off when signal CLKin has the value '0'.

Alternatively, the positive output of switch 62 (see FIG. 13) could be controlled e.g. by a digital AND-gate, which receives the signal RST as a further input. Then, if the RST signal is '1', the output of this AND-gate, which is fed into the positive input of delay element 63-1 and also into the upper input port of phase detector 61', has the same value as signal INP. In contrast, if the RST signal is '0', the output of the AND-gate has always value '0'. Therein, the negative input port of delay element 63-1 would be fed with the inverted output of the AND-gate. This negative input of delay element 63-1 can be produced from the output of the AND-gate in several different ways that are known to a person skilled in the art.

Figure 18:
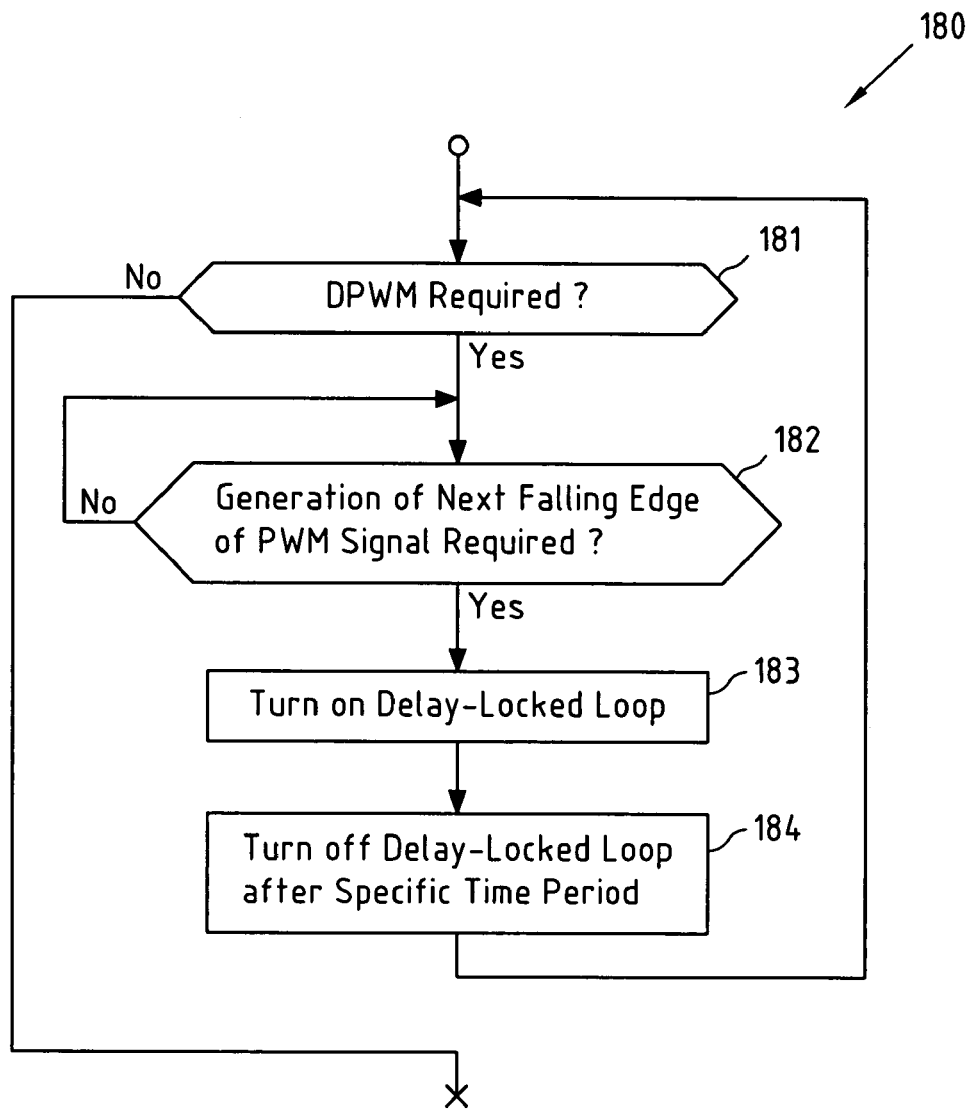
FIG. 18: a flowchart of an exemplary embodiment of a method according to the present invention.

FIG. 18 is a flowchart 180 of an exemplary embodiment of a method according to the present invention. The steps of flowchart 180 may for instance be executed by digital control unit 10 of the device of FIG. 1 when controlling DLL 12.

In a first step 181, it is checked whether DWPM is required at all, i.e. if the device is in operation. If this is true, it is checked in a step 182 if generation of a next falling edge of the PWM signal to be generated is required. Otherwise, the method terminates.

If step 182 produces a positive result, DLL 12 is turned on in a step 183, for instance via control signal ENdll (see FIG. 1). Otherwise, the methods steps back to step 182 and repeats checking if generation of a next falling edge is required.

In a step 184, DLL 12 is turned off again after a specific time to reduce power consumption. This may again be accomplished via control signal ENdll.

The method then returns to step 181 and checks if DPWM is still required, i.e. if the device is still in operation.

The invention has been described above by means of exemplary embodiments. It should be noted that there are alternative ways and variations which are obvious to a skilled person in the art and can be implemented without deviating from the scope and spirit of the appended claims.

Furthermore, it is readily clear for a skilled person that the logical blocks in the schematic block diagrams as well as the flowchart and algorithm steps presented in the above description may at least partially be implemented in electronic hardware and/or computer software, wherein it depends on the functionality of the logical block, flowchart step and algorithm step and on design constraints imposed on the respective devices to which degree a logical block, a flowchart step or algorithm step is implemented in hardware or software. The presented logical blocks, flowchart steps and algorithm steps may for instance be implemented in one or more digital signal processors, application specific integrated circuits, field programmable gate arrays or other programmable devices. The computer software may be stored in a variety of storage media of electric, magnetic, electromagnetic or optic type and may be read and executed by a processor, such as for instance a microprocessor. To this end, the processor and the storage medium may be coupled to interchange information, or the storage medium may be included in the processor.

What is claimed is:

1. A device, comprising:
 a delay-locked loop circuitry configured to trigger generation of first-type edges of a target signal for use with a digital pulse-width modulator in a digital feedback loop of a switched-mode power supply, and a main control circuitry configured to control operation of said delay-locked loop circuitry in a way that said delay-locked loop circuitry is turned on before generation of each first-type edge of said target signal and turned off after generation of each said first-type edge, wherein said delay-locked loop circuitry is configured to trigger generation of said first-type edges of said target signal at least partially based on a first clock signal, wherein said delay-locked loop circuitry comprises:

a delay-locked loop configured to output a plurality of delayed representations of said first clock signal, and a combination circuitry configured to combine said plurality of delayed representations of said first clock signal into a signal via which said delay-locked loop circuitry triggers generation of said first-type edges of said target signal, wherein an operation of said combination circuitry is controlled by said main control circuitry, wherein said delay-locked loop comprises:

a switch configured to receive a representation of said first clock signal;

a line of delay elements connected to an output of said switch, wherein said delay elements in said line of delay elements generate said plurality of delayed representations of said first clock signal;

a phase detector configured to control said delay elements based on a comparison of two different representations of said first clock signal, and a switch and phase detector control circuitry configured to control operation of said switch of said delay-locked loop and to turn on and off said phase detector of said delay-locked loop in response to at least one control signal generated by said main control circuitry.

2. The device of claim 1, wherein said main control circuitry is further configured to trigger generation of second-type edges of said target signal.

3. The device of claim 1, wherein said main control circuitry controls operation of said delay-locked loop circuitry at least partially based on an input signal received by said main control circuitry.

4. The device of claim 1, further comprising a switching circuitry configured to generate said target signal, wherein generation of said first-type edges of said target signal is triggered via a switching signal generated by said delay-locked loop circuitry.

5. The device of claim 1, further comprising:

a clock multiplier configured to change a frequency of a second clock signal to obtain said first clock signal.

6. The device of claim 5, wherein said clock multiplier comprises a delay-locked loop.

7. The device of claim 6, wherein said delay-locked loop comprises:

a line of delay elements that is fed with said second clock signal, a phase detector configured to control said delay elements based on a comparison of said second clock signal and a delayed representation of said second clock signal, at least one combination circuitry configured to combine delayed representations of said second clock signal to obtain a switching signal, and a switching circuitry configured to generate said first clock signal at least partially based on said switching signal of said at least one combination circuitry.

8. The device of claim 1, wherein said switch and phase detector control circuitry is configured to close said switch of said delay-locked loop before said phase detector of said delay-locked loop is turned on, if said at least one control signal indicates that said delay-locked loop circuitry shall be turned on to generate a first-type edge of said target signal.

9. The device of claim 1, wherein said switch and phase detector control circuitry is configured to open said switch of said delay-locked loop and to turn off said phase detector of said delay-locked loop, if said at least one control signal indicates that said delay-locked loop circuitry shall be turned off after generation of a first-type edge.

10. The device of claim 1, wherein said phase detector controls operation of said delay elements via a control voltage, and wherein said phase detector comprises a capacitor for storing a specific control voltage during the time period said phase detector is turned off.

11. The device of claim 1, wherein said target signal is a pulse-width modulated signal.

12. The device of claim 11, wherein said pulse-width modulated signal controls a switching circuitry of a switched-mode power supply.

13. The device of claim 1, further comprising:

a switching circuitry configured to apply a supply voltage to a load via an inductive element in response to said target signal; and an analog-to-digital converter configured to convert an analog voltage signal tapped between said inductive element and said load into a digital signal, wherein said main control circuitry controls operation of said delay-locked loop circuitry at least partially based on said digital signal.

14. A device, comprising:

means for triggering generation of first-type edges of a target signal for use with a digital pulse-width modulator in a digital feedback loop of a switched-mode power supply, and means for controlling operation of said means for triggering generation of said first-type edges of said target signal in a way that said means for triggering generation of said first-type edges of said target signal is turned on before generation of each first-type edge of said target signal and turned off after generation of each said first-type edge, wherein said means for triggering is configured to trigger generation of said first-type edges of said target signal at least partially based on a first clock signal, wherein said means for triggering comprises:

means for outputting a plurality of delayed representations of said first clock signal, and means for combining said plurality of delayed representations of said first clock signal into a signal via which said means for triggering triggers generation of said first-type edges of said target signal, wherein an operation of said means for combining is controlled by said means for controlling, wherein said means for outputting a plurality of delayed representations comprises:

means for receiving a representation of said first clock signal;

a line of delay elements connected to an output of said means for receiving a representation of said first clock signal, wherein said delay elements in said line of delay elements generate said plurality of delayed representations of said first clock signal;

means for controlling said delay elements based on a comparison of two different representations of said first clock signal, means for controlling operation of said means for receiving a representation of said first clock signal and for turning on and off said means for controlling said delay elements in response to at least one control signal generated by said means for controlling operation of said means for triggering generation of said first-type edges.

15. The device of claim 14, wherein said target signal is a pulse-width modulated signal, and wherein said device further comprises:
means for controlling a switching circuitry of a switched-mode power supply at least partially based on said pulse-width modulated signal.

16. A chip, implementing:
a delay-locked loop circuitry configured to trigger generation of first-type edges of a target signal, and
a main control circuitry configured to control operation of said delay-locked loop circuitry in a way that said delay-locked loop circuitry is turned on before generation of each first-type edge of said target signal and turned off after generation of each said first-type edge, wherein said delay-locked loop circuitry is configured to trigger generation of said first-type edges of said target signal at least partially based on a first clock signal, wherein said delay-locked loop circuitry comprises:
a delay-locked loop configured to output a plurality of delayed representations of said first clock signal, and
a combination circuitry configured to combine said plurality of delayed representations of said first clock signal into a signal via which said delay-locked loop circuitry triggers generation of said first-type edges of said target signal, wherein an operation of said combination circuitry is controlled by said main control circuitry, wherein said delay-locked loop comprises:
a switch configured to receive a representation of said first clock signal;
a line of delay elements connected to an output of said switch, wherein said delay elements in said line of delay elements generate said plurality of delayed representations of said first clock signal;
a phase detector configured to control said delay elements based on a comparison of two different representations of said first clock signal, and
a switch and phase detector control circuitry configured to control operation of said switch of said delay-locked loop and to turn on and off said phase detector of said delay-locked loop in response to at least one control signal generated by said main control circuitry.

17. The chip of claim 16, wherein said target signal is a pulse-width modulated signal that controls a switching circuitry of a switched-mode power supply.

18. A method, comprising:
controlling operation of a delay-locked loop circuitry, wherein said delay-locked loop circuitry is configured to trigger generation of first-type edges of a target signal for use with a digital pulse-width modulator in a digital feedback loop of a switched-mode power supply, and wherein operation of the delay-locked loop circuitry is controlled in a way that said delay-locked loop circuitry is turned on before generation of each first-type edge of said target signal and turned off after generation of each said first-type edge, triggering generation of said first-type edges of said target signal at least partially based on a first clock signal,
outputting a plurality of delayed representations of said first clock signal,
combining said plurality of delayed representations of said first clock signal into a signal used for triggering generation of said first-type edges of said target signal,
receiving a representation of said first clock signal;
controlling delay elements used to generate said plurality of delayed representations of said first clock signal based on a comparison of two different representations of said first clock signal, and
controlling said receiving and turning on and off said controlling of said delay elements in response to at least one control signal.

19. The method of claim 18, wherein said target signal is a pulse-width modulated signal, and wherein said method further comprises:
controlling a switching circuitry of a switched-mode power supply at least partially based on said pulse-width modulated signal.

20. A computer-readable medium having a computer program stored thereon, the computer program comprising:
instructions operable to cause a processor to control operation of a delay-locked loop circuitry, wherein said delay-locked loop circuitry is configured to trigger generation of first-type edges of a target signal for use with a digital pulse-width modulator in a digital feedback loop of a switched-mode power supply, and wherein operation of the delay-locked loop circuitry is controlled in a way that said delay-locked loop circuitry is turned on before generation of each first-type edge of said target signal and turned off after generation of each said first-type edge, wherein said delay-locked loop circuitry is configured to trigger generation of said first-type edges of said target signal at least partially based on a first clock signal, wherein said delay-locked loop circuitry comprises:
a delay-locked loop configured to output a plurality of delayed representations of said first clock signal, and
a combination circuitry configured to combine said plurality of delayed representations of said first clock signal into a signal via which said delay-locked loop circuitry triggers generation of said first-type edges of said target signal, wherein an operation of said combination circuitry is controlled by a main control circuitry, wherein said delay-locked loop comprises:
a switch configured to receive a representation of said first clock signal;
a line of delay elements connected to an output of said switch, wherein said delay elements in said line of delay elements generate said plurality of delayed representations of said first clock signal;
a phase detector configured to control said delay elements based on a comparison of two different representations of said first clock signal, and
a switch and phase detector control circuitry configured to control operation of said switch of said delay-locked loop and to turn on and off said phase detector of said delay-locked loop in response to at least one control signal generated by said main control circuitry.

21. The computer-readable medium of claim 20, wherein said target signal is a pulse-width modulated signal, and wherein said computer-readable medium further comprises:
instructions operable to control a switching circuitry of a switched-mode power supply at least partially based on said pulse-width modulated signal.

* * * * *